(12) United States Patent
Pan et al.

(10) Patent No.: US 10,214,295 B2
(45) Date of Patent: *Feb. 26, 2019

(54) HIGH-EFFICIENCY, LIGHTWEIGHT SOLAR SHEETS

(71) Applicant: MICROLINK DEVICES, INC., Niles, IL (US)

(72) Inventors: Noren Pan, Wilmette, IL (US); Raymond Chan, Hoffman Estates, IL (US); Haruki Miyamoto, Arlington Heights, IL (US); Andree Wibowo, Des Plaines, IL (US); Mark Osowski, Vernon Hills, IL (US); Christopher Youtsey, Libertyville, IL (US); David McCallum, West Chicago, IL (US)

(73) Assignee: MICROLINK DEVICES, INC., Niles, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/589,342

(22) Filed: May 8, 2017

(65) Prior Publication Data

US 2017/0305564 A1    Oct. 26, 2017

Related U.S. Application Data

(63) Continuation of application No. 15/131,754, filed on Apr. 18, 2016, now Pat. No. 9,650,148, which is a
(Continued)

(51) Int. Cl.
*H01L 31/046* (2014.01)
*B64D 27/24* (2006.01)
(Continued)

(52) U.S. Cl.
CPC .............. *B64D 27/24* (2013.01); *B60L 8/003* (2013.01); *B64C 39/024* (2013.01);
(Continued)

(58) Field of Classification Search
CPC ......... B64D 27/24; B64D 221/00; B60L 8/00; B60L 11/1809; B60L 11/1881;
(Continued)

(56) References Cited

U.S. PATENT DOCUMENTS 4,697,761 A    10/1987   Long
5,810,284 A    9/1998    Hibbs et al.
(Continued)

FOREIGN PATENT DOCUMENTS

WO    2010111295 A2    9/2010
WO    2010129566 A1    11/2010

OTHER PUBLICATIONS

MicroLink Devices Inc., MicroLink Devices Contract to Develop High-Efficiency Solar Sheets for UAVs Extended. Nov. 22, 2011, 1 page.
(Continued)

*Primary Examiner* — Robert Deberadinis
(74) *Attorney, Agent, or Firm* — McCarter & English, LLP; David R. Burns

(57) ABSTRACT

Some embodiments include a high efficiency, lightweight solar sheet. Some embodiments include a solar sheet configured for installation on a surface of a UAV or on a surface of a component of a UAV. The solar sheet includes a plurality of solar cells and a polymer layer to which the plurality of solar cells are attached. Some embodiments include a kit for supplying solar power in a battery-powered or fuel cell powered unmanned aerial vehicle (UAV) by incorporating flexible solar cells into a component of a UAV, affixing flexible solar cells to a surface of a UAV, or affixing flexible solar cells to a surface of a component of a UAV. The kit also includes a power conditioning system configured to operate the solar cells within a desired power range and
(Continued)

configured to provide power having a voltage compatible with an electrical system of the UAV.

20 Claims, 15 Drawing Sheets

Related U.S. Application Data

(60) continuation-in-part of application No. 13/769,223, filed on Feb. 15, 2013, now Pat. No. 9,315,267.

(60) Provisional application No. 61/599,390, filed on Feb. 15, 2012.

(51) Int. Cl.
  *B60L 8/00* (2006.01)
  *B64C 39/02* (2006.01)
  *H02S 10/40* (2014.01)
  *B60L 11/18* (2006.01)

(52) U.S. Cl.
  CPC ............ *H01L 31/046* (2014.12); *H02S 10/40* (2014.12); *B60L 11/1809* (2013.01); *B60L 11/1881* (2013.01); *B60L 2200/10* (2013.01); *B64C 2201/021* (2013.01); *B64C 2201/042* (2013.01); *B64D 2211/00* (2013.01); *B64D 2221/00* (2013.01); *Y02T 10/7083* (2013.01)

(58) Field of Classification Search
  CPC ...... B60L 8/003; B60L 27/24; B60L 2211/00; B60L 2221/00; B60L 2201/021; B60L 2201/042; B60L 2200/10; H01L 31/046; H02S 10/40; B64C 39/024; B64C 2201/021; B64C 2201/042; Y02T 10/7083

See application file for complete search history.

(56) References Cited

U.S. PATENT DOCUMENTS

| | | |
|---|---|---|
| 6,868,314 B1 | 3/2005 | Frink |
| 7,398,946 B1 | 7/2008 | Marshall |
| 7,762,495 B2 | 7/2010 | Miller |
| 8,201,773 B1 | 6/2012 | Durham et al. |
| 9,650,148 B2 * | 5/2017 | Pan ........................ B64D 27/24 |
| 2009/0038678 A1 | 2/2009 | Pan et al. |
| 2011/0073717 A1 | 3/2011 | Foucault et al. |
| 2011/0318866 A1 | 12/2011 | Pan et al. |
| 2013/0285440 A1 | 10/2013 | Pan et al. |

OTHER PUBLICATIONS

International Search Report and Written Opinion for Application No. PCT/US2017/028108, dated Jan. 24, 2018. 11 pages.

International Search Report and Written Opinion of the International Searching Authority for PCT/US2013/026525, dated Dec. 12, 2013.

International Preliminary Report on Patentability of the International Bureau of WIPO for PCT/US2013/026525, dated Aug. 19, 2014.

Anonymous: "Solar Cells Increase UAV Stamina, Flight Time", Sep. 28, 2011, XP055091247.

Coba, Javier V.: "Application of Copper Indium Gallium Diselenide Photovoltaic Cells to Extend the Endurance and Capabilities of the Raven RQ-11B Unmanned Aerial Vehicle", Sep. 30, 2010, XP055091402.

Cornfeld, Arthur B. et al: "The 3J-IMM Solar Cell: Pathways for Insertion Into Space Power Systems", 2009 34th IEEE Photovoltaic Specialists Conference (PVSC), Jun. 1, 2009, pp. 000954-000959; XP055091351.

* cited by examiner

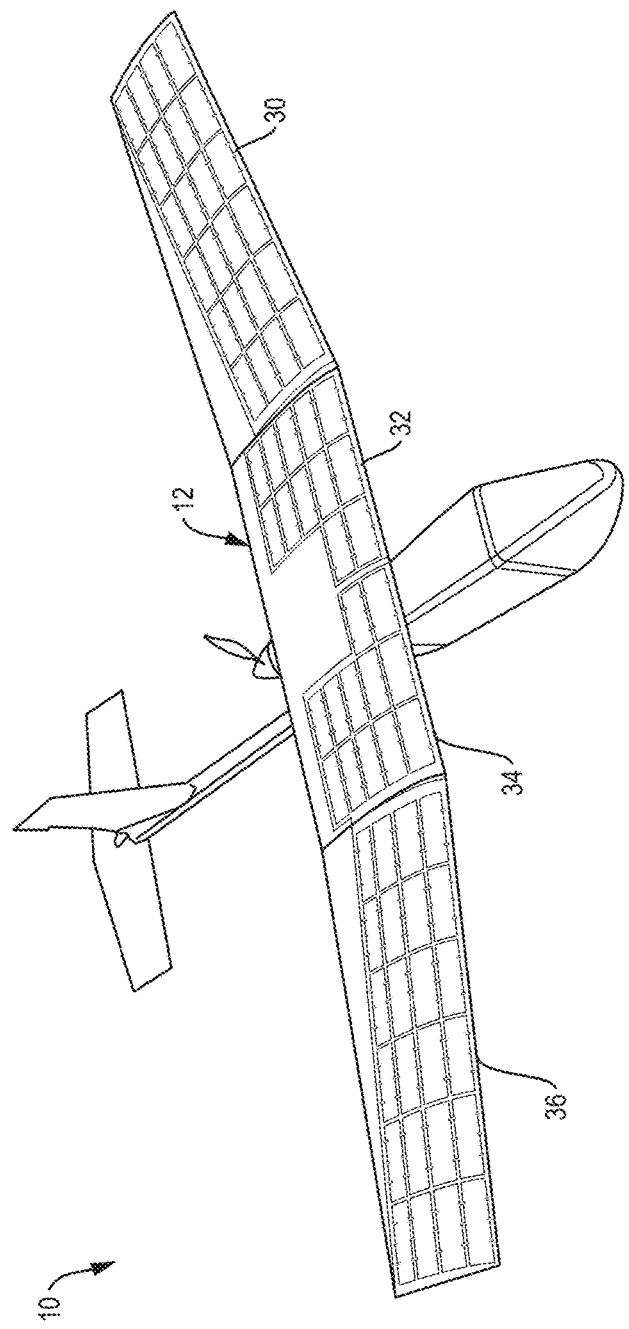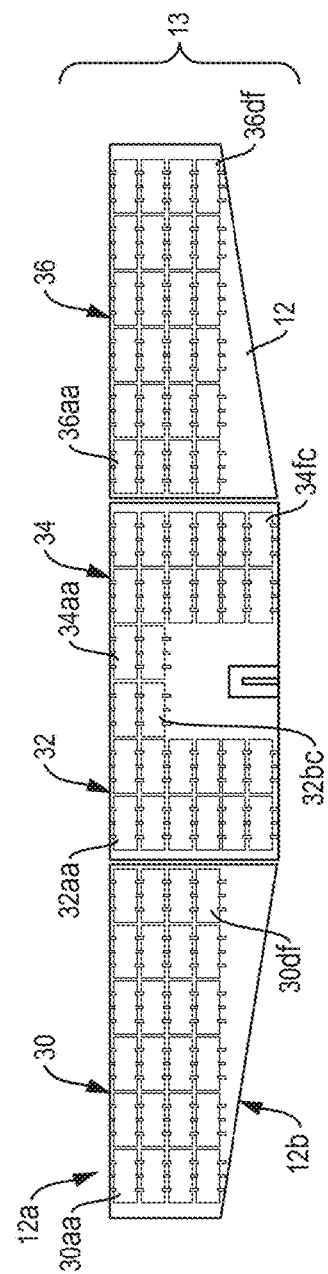
FIG. 1
FIG. 2

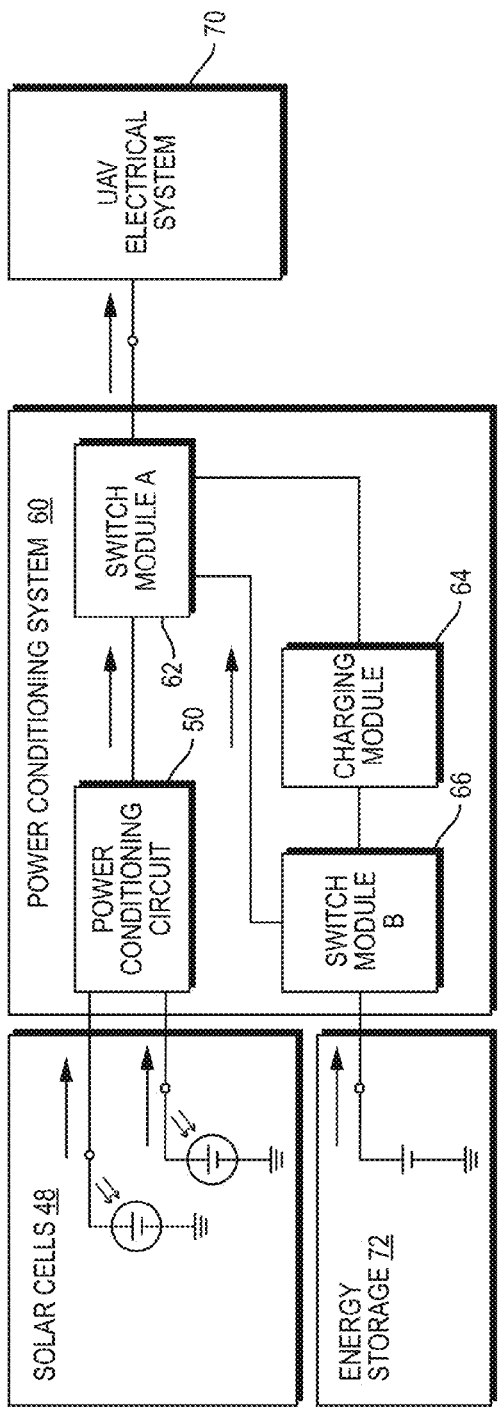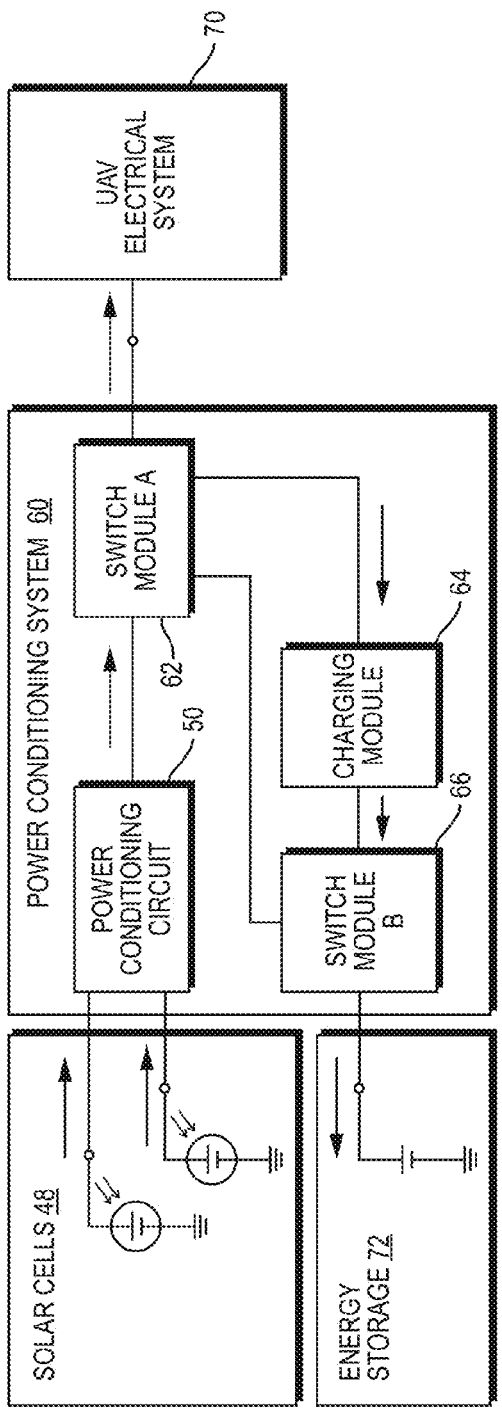

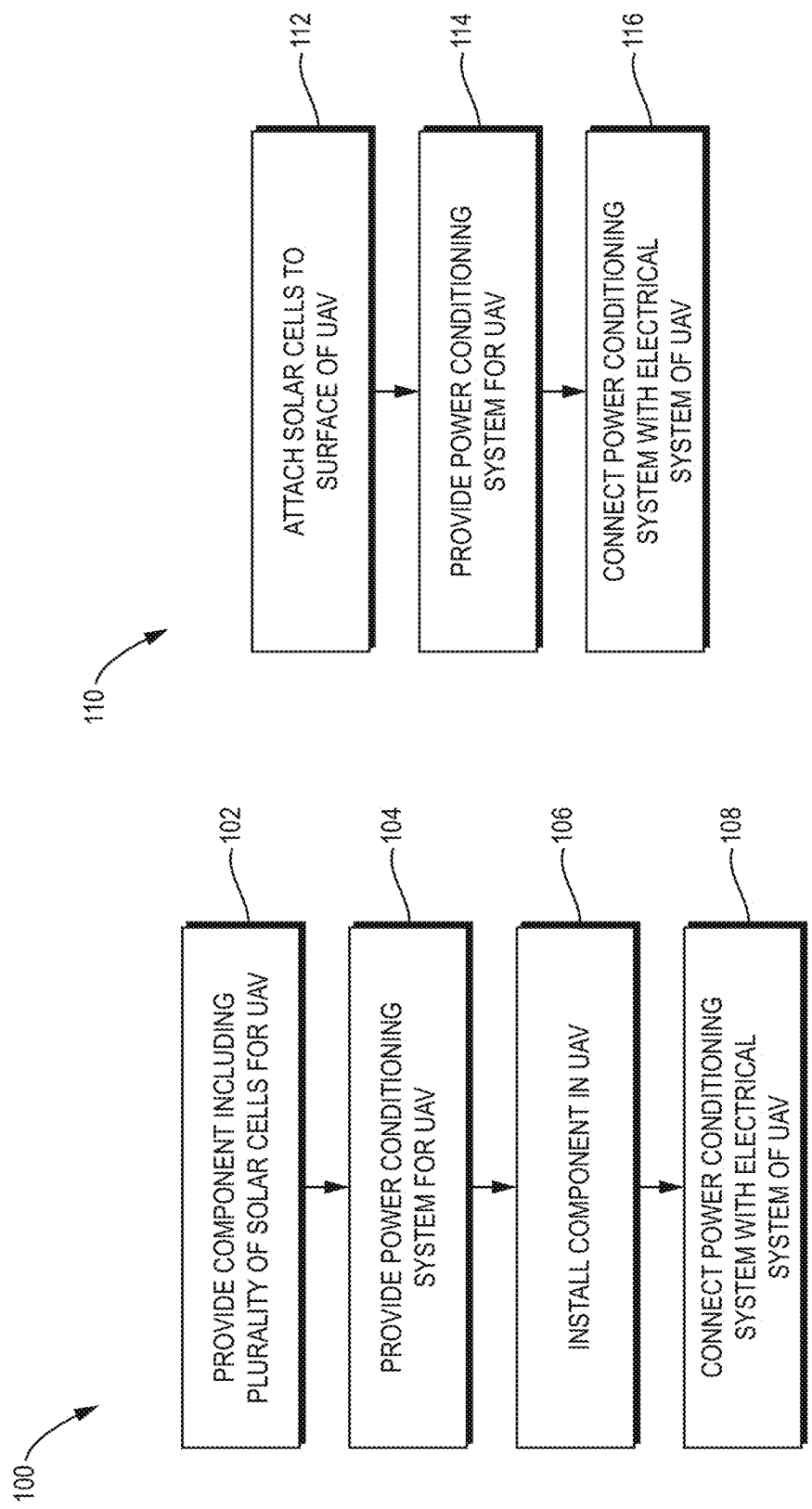

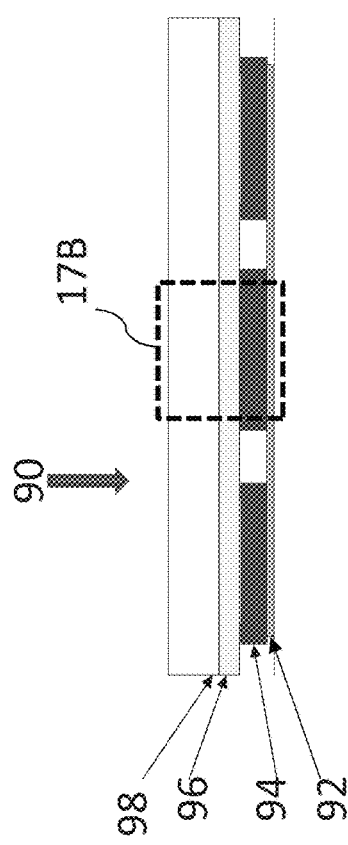
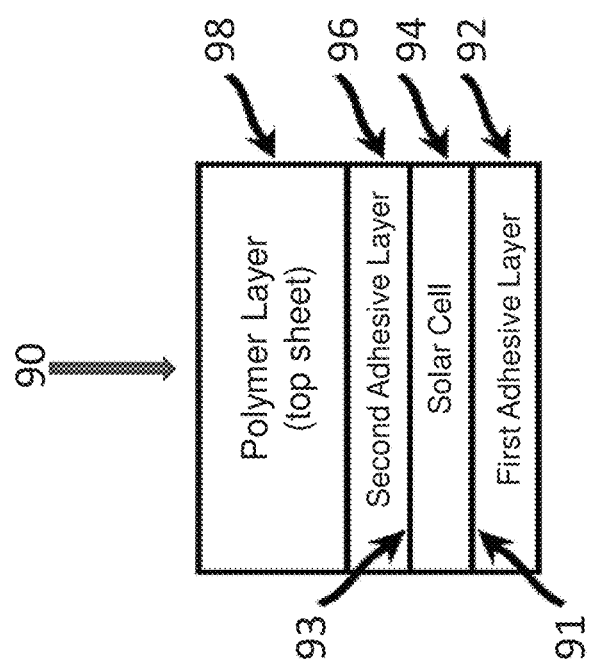
FIG. 17A
FIG. 17B

HIGH-EFFICIENCY, LIGHTWEIGHT SOLAR SHEETS

RELATED APPLICATIONS

The present application is a continuation of U.S. patent application Ser. No. 15/131,754, filed Apr. 18, 2016, which is a continuation-in-part of U.S. patent application Ser. No. 13/769,223, filed Feb. 15, 2013, which claims the benefit of U.S. Provisional Patent Application No. 61/599,390, filed Feb. 15, 2012. The entire contents of each of these applications are hereby incorporated by reference.

STATEMENT OF GOVERNMENT INTEREST

This invention was made with government support under Contract No. FA8650-09-D-5037 awarded by the Air Force Research Laboratory (AFRL). The government has certain rights in this invention.

BACKGROUND

Many of the current generation of unmanned aerial vehicles (UAVs) are electrically powered. Most electrically powered small UAVs are battery-powered, such as the RAVEN, WASP III, and PUMA AE by AeroVironment, Inc. of Monrovia, Calif., SCANEAGLE by Boeing of Seattle, Wash., and the MAVERIC UAS by PRIORIA ROBOTICS of Gainesville, Fla. The endurance (i.e., total flight time of the vehicle with a full battery charge) of the current generation of small, electrically-powered unmanned aerial vehicles (UAVs) is limited by power consumed by the UAV and the energy storage capacity of the battery. For example, the endurance of the RAVEN UAV is limited to approximately 90 minutes of flight time. The limit on endurance of small UAVs reduces the operational effectiveness of the small UAVs because it limits the time the UAV can spend over a target of interest, and limits a distance range for targets.

A High-Altitude Long Endurance (HALE) UAV is an airborne vehicle which functions optimally at high altitude (e.g., at least 30,000 feet or 9,000 meters above sea level) and is capable of flights which last for considerable periods of time (e.g., greater than 24 hours) without recourse to landing. Generally, recent generations of HALE UAVs are capable of operating at high altitudes and longer flight times than prior generations. Some examples of HALE UAVs are GLOBAL HAWK by Northrop Grumman Corp. of Falls Church, Va., ALTUS II by General Atomics Aeronautical Systems Inc. of San Diego, Calif., PHANTOM EYE by Boeing of Seattle, Wash., and ZEPHYR by Airbus Defense and Space of Farnborough, UK. Recently some HALE UAVs, such as ZEPHYR, have been produced that can fly at a maximum altitude 70,000 feet. For some types of HALE UAVs the need to refuel can set a limit on the maximum flight time or endurance of the UAV. For some types of HALE UAVs that are powered exclusively by solar cells, a reduction in the mass of the solar cells could increase the payload capacity of the HALE UAV.

SUMMARY

Some embodiments described herein increase an endurance of a battery-powered or fuel cell powered unmanned aerial vehicles (UAV) by adding a secondary power source in the form of a plurality of solar cells attached to, or incorporated into, a surface of the UAV or of a component of the UAV. Endurance of a battery-powered or fuel cell powered UAV may be defined as a total flight time with an initially fully charged battery or as a total flight time with an initial specified battery charge level. Some embodiments include kits for increasing endurance of a battery-powered or fuel cell powered UAV.

Some embodiments described herein provide solar sheets including a plurality of flexible solar cells configured to be attached to a component of a UAV. A high specific power (ratio of power to mass) of the solar cells and the solar sheets may reduce an overall weight required to generate an amount of power for a UAV. In some embodiments, this can increase the number of solar cells that can be used on the UAV to generate power for the same amount of weight. In some embodiments, this can increase the payload capacity of the UAV for the same number of solar cells.

In one embodiment, a kit for supplying solar power in a battery-powered or fuel cell powered UAV includes a plurality of solar cells configured to be installed on a surface of a battery-powered or fuel cell powered UAV. Each of the plurality of solar cells has a specific power in a range of 1500-4500 W/kg under air mass coefficient 1.5 (AM1.5) light or a specific power in a range of 1870-5680 W/kg under air mass coefficient 0 (AM0) light. The kit also includes a power conditioning system configured to operate the plurality of solar cells within a desired power range and configured to provide power in the form of a voltage compatible with an electrical system of the UAV.

In some embodiments, each of the plurality of solar cells has a specific power in a range of 2000-4500 W/kg under AM1.5 light or a specific power in a range of 2520-5680 W/kg under AM0. In some embodiments, each of the plurality of solar cells has a specific power in a range of 2500-4500 W/kg under AM1.5 light or a specific power in a range of 3150-5680 W/kg under AM0. In some embodiments, each of the plurality of solar cells has an areal power in a range of 260-360 W/m$^2$ under AM1.5 light or an areal power in a range of 325-450 W/m$^2$ under AM0. In some embodiments, each of the plurality of solar cells has an areal mass in a range of 70-280 g/m$^2$.

The power conditioning system may include a power conditioning circuit. In some embodiments, the power conditioning system also include an electrical connection system configured to connect the power conditioning circuit with the plurality of solar cells and to connect the power conditioning circuit with an electrical system of the UAV.

In some embodiments, at least a portion of the surface on which a solar cell is to be disposed is on a wing of the UAV.

In some embodiments, the plurality of solar cells is incorporated into at least one flexible solar sheet. In some embodiments, the at least one flexible solar sheet has a specific power in a range of 800-2350 W/kg under AM1.5 light or in a range of 1020-3000 W/kg under AM0. In some embodiments, the at least one flexible solar sheet has a specific power in a range of 1000-2350 W/kg under AM1.5 light or in a range of 1270-3000 W/kg under AM0. In some embodiments, the at least one flexible solar sheet has an areal mass in a range of 120-570 g/m$^2$. In some embodiments, the at least one flexible solar sheet has an areal mass in a range of 120-300 g/m$^2$. The plurality of solar cells may include inverted metamorphic solar cells. The plurality of solar cells may also include solar cells produced using an epitaxial lift-off process.

In some embodiments, the kit is configured to retrofit a previously-produced UAV. In some embodiments, the kit is configured for upgrading a UAV during production. In some embodiments, kit is configured to provide between 40% and 99% of the average power consumed by the UAV during use. In another embodiment, the kit is configured to provide between 50% and 99% of the average power consumed by the UAV during use.

Another embodiment of the technology is directed to a kit for supplying power in a battery-powered or fuel cell powered UAV that includes a component of an unmanned aerial vehicle. The component may include a plurality of solar cells and the component configured to be installed on a battery-powered or fuel cell powered UAV. In some embodiments, each of the plurality of solar cells has a specific power in a range of 1500-4500 W/kg under air mass coefficient 1.5 (AM1.5) light or a specific power in a range of 1870-5680 W/kg under AM0. The kit may also include a power conditioning system configured to operate the plurality of solar cells within a desired power range and configured to provide power in the form of a voltage compatible with an electrical system of the UAV.

Another embodiment of the technology is directed to a solar sheet for installation on a component of a UAV. The solar sheet may include a plurality of solar cells each having a top surface and a specific power in a range of 1000-4500 W/kg for AM1.5 light or a specific power in a range of 1270-5680 W/kg under AM0. The solar sheet may further include a polymer layer to which the plurality of solar cells is attached.

In some embodiments, each of the plurality of solar cells in the solar sheet has a specific power in a range of 1500-4500 W/kg under AM1.5 light or a specific power in a range of 1870-5680 W/kg under AM0. In some embodiments, each of the plurality of solar cells in the solar sheet has a specific power in a range of 2000-4500 W/kg under AM1.5 light or a specific power in a range of 2520-5680 W/kg under AM0. In some embodiments, each of the plurality of solar cells has a specific power in a range of 2500-4500 W/kg under AM1.5 light or a specific power in a range of 3150-5680 W/kg under AM0.

In some embodiments, the solar sheet has a specific power in a range of 400-2350 W/kg under AM1.5 light or in a range of 510-3000 W/kg under AM0. In some embodiments, the solar sheet has a specific power in a range of 800-2350 W/kg under AM1.5 light or in a range of 1020-3000 W/kg under AM0. In some embodiments, the solar sheet has a specific power in a range of 1000-2350 W/kg under AM1.5 light or in a range of 1270-3000 W/kg under AM0.

In some embodiments, each of the plurality of solar cells has an areal power in a range of 260-360 W/m$^2$ under AM1.5 light or an areal power in a range of 325-450 W/m$^2$ under AM0. In some embodiments, the solar sheet has an areal power in a range of 200-330 W/m$^2$ under AM1.5 light or an areal power in a range of 260-410 W/m$^2$ under AM0. In some embodiments, each of the plurality of solar cells has an areal mass in a range of 70-280 g/m$^2$. In some embodiments, the solar sheet has an areal mass in a range of 120-570 g/m$^2$. In some embodiments, the solar sheet has an areal mass in a range of 120-300 g/m$^2$.

In some embodiments, the solar sheet is configured to be attached to a wing. In some embodiments, the solar sheet is a flexible solar sheet.

In some embodiments, the polymer layer has a thickness in a range of 15 microns and 30 microns.

Each of the plurality of solar cells may include a metal backing layer. In some embodiments, the metal backing layer has a thickness in a range of 2 to 30 microns. In some embodiments, the metal backing layer has a thickness in a range of 2 to 15 microns.

In some embodiments, the solar sheet includes a first adhesive layer configured to attach the solar sheet to a component of a UAV. In some embodiments, the first adhesive layer is in contact with a bottom surface of each solar cell in the plurality of solar cells. The first adhesive layer may have a thickness in a range of 8 microns and 15 microns. In some embodiments, the first adhesive layer includes a plurality of cutouts, each of the plurality of cutouts corresponding to a position of a corresponding solar cell in the plurality of solar cells.

In some embodiments, the solar sheet includes a first adhesive layer in contact with a bottom surface of each solar cell in the plurality of solar cells.

In some embodiments, the solar sheet includes a second adhesive layer that attaches the plurality of solar cells to the polymer layer. The second adhesive layer may have a thickness in a range of 8 microns and 15 microns.

In some embodiments, the solar sheet includes a second polymer sheet attached to the plurality of solar cells by the first adhesive layer.

In some embodiments, each of the solar cells is an inverted metamorphic (IMM) triple-junction solar cell. In some embodiments, the IMM triple-junction solar cell includes a top subcell including an AlInGaP layer; a middle subcell including a GaAs layer; a bottom subcell including an InGaAs layer; and a metal backing layer in contact with the bottom cell. In some embodiments, the IMM triple-junction solar cell includes a top subcell including an InGaP layer; a middle subcell including a GaAs layer; a bottom subcell including an InGaAs layer; and a metal backing layer in direct contact with the bottom subcell. In some embodiments, each of the plurality of solar cells is formed by an epitaxial lift off process.

Another embodiment of the technology is directed to a method of increasing an endurance of a battery-powered or fuel cell powered UAV. The method includes providing a component of a UAV. The component may include a plurality of solar cells, each of the plurality of solar cells having a specific power in a range of 1500-4500 W/kg under air mass coefficient 1.5 (AM1.5) light or a specific power in a range of 1870-5680 W/kg under AM0. The method further includes providing a power conditioning system configured to operate the plurality of solar cells within a desired power range and configured to provide power in the form of a voltage compatible with an electrical system of a UAV. The method also includes installing the component in a UAV and connecting the power conditioning system with the electrical system of the UAV.

In some embodiments, the component is at least a portion of a wing. Installing the component in the UAV includes replacing a previously-produced component in a previously-produced UAV with the provided component. In some embodiments, installing the component in the UAV occurs during manufacturing of the UAV.

The plurality of solar cells can be incorporated into at least one flexible solar sheet. In some embodiments, the at least one flexible solar sheet has a specific power in a range of 800-2350 W/kg under AM1.5 light or in a range of 1020-3000 W/kg under AM0. In some embodiments, the at least one flexible solar sheet has a specific power in a range of 1000-2350 W/kg under AM1.5 light or in a range of 1270-3000 W/kg under AM0.

Another embodiment of the technology is directed to a method of increasing an endurance of a battery-powered or fuel cell powered UAV. The method includes attaching a plurality of solar cells to a surface of a battery-powered or fuel cell powered UAV, each of the plurality of solar cells having a specific power in a range of 1500-4500 W/kg under air mass coefficient 1.5 (AM1.5) light or a specific power in a range of 1870-5680 W/kg under AM0. The method further includes providing a power conditioning system configured to operate the plurality of solar cells within a desired power range and configured to provide power in the form of a voltage compatible with an electrical system of the UAV. The method also includes connecting the power conditioning system with the electrical system of the UAV.

In some embodiments, attaching a plurality of solar cells to a surface of at least a portion of a battery-powered or fuel cell powered UAV includes attaching the plurality of solar cells to a surface of a wing of the UAV. In some embodiments, attaching a plurality of solar cells to a surface of at least a portion of a battery-powered or fuel cell powered UAV includes attaching the plurality of solar cells to a surface of at least a portion of a previously-produced battery-powered or fuel cell powered UAV. In some embodiments, attaching a plurality of solar cells to a surface of at least a portion of a battery-powered or fuel cell powered UAV can occur during initial production of the battery-powered or fuel cell powered UAV.

BRIEF DESCRIPTION OF THE DRAWINGS

The foregoing and other objects, features and advantages of the invention will be apparent from the following description, and from the accompanying drawings, in which like reference characters refer to the same parts throughout the different views. The drawings illustrate principles of the invention and are not to scale.

FIG. 1 depicts a perspective view of a kit including a plurality of solar cells installed on an unmanned aerial vehicle (UAV), in accordance with an embodiment.

FIG. 2 schematically depicts a plan view of a wing component of a UAV with installed solar cells, in accordance with an embodiment.

FIG. 6 is a block diagram of a power conditioning system in a first mode in which the solar cells provide supplemental power for a UAV.

FIG. 7 is a block diagram of the power conditioning system in a second mode in which the solar cells provide operating power for the UAV and charge an energy storage device of the UAV system.

FIG. 9 is a block diagram of a method of increasing endurance of a battery-powered or fuel cell powered UAV in accordance with an embodiment.

FIG. 10 is a block diagram of another method of increasing endurance of a battery-powered or fuel cell powered UAV in accordance with an embodiment.

FIG. 17A schematically depicts a side cross-sectional view of example solar sheet, in accordance with some embodiments.

FIG. 17B schematically depicts a detail of the solar sheet of FIG. 17A.

DETAILED DESCRIPTION

Figure 3:
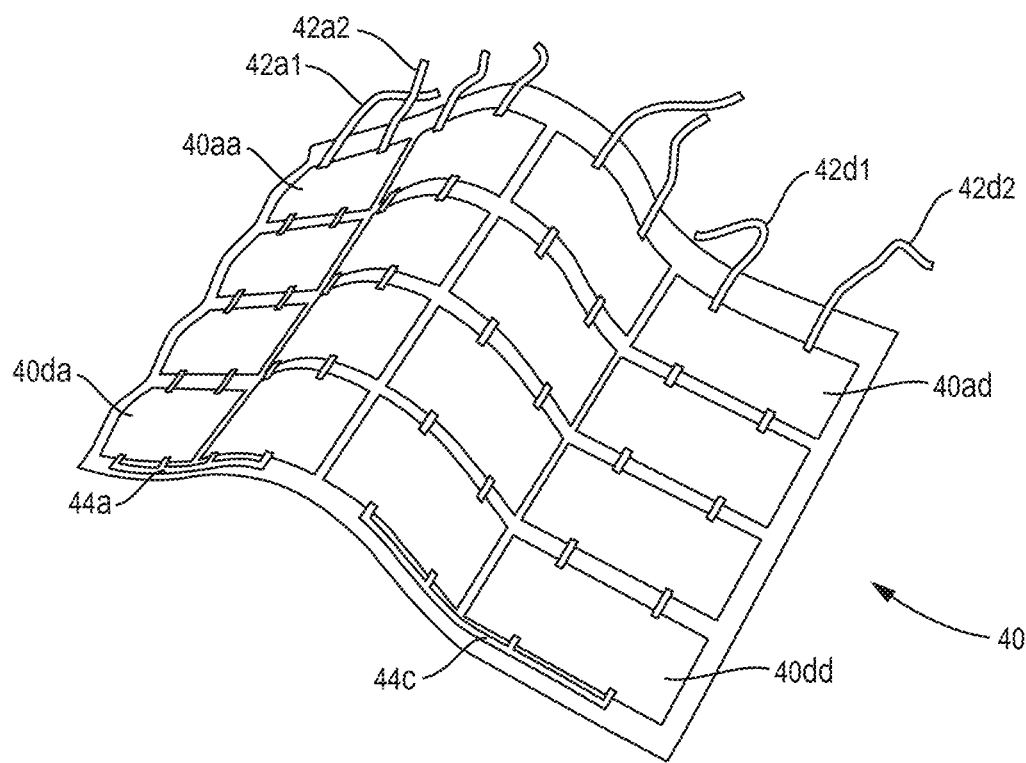
FIG. 3 is a perspective view of a solar sheet including a plurality of solar cells illustrating the flexibility of the solar cells and of the solar sheet, in accordance with an embodiment.

The endurance of the current generation of small UAVs and some HALE UAVs is limited due the operational power requirements for the UAV and the limited energy storage capacity of the battery (e.g., the endurance of the RAVEN small UAV is 60-90 minutes). Increasing endurance enhances the operational effectiveness of a small UAVs and HALE UAVs because a UAV with enhanced endurance can spend more time over the target of interest and/or can travel to targets further away. Adding additional batteries may increase the endurance of a UAV; however the additional batteries would substantially increase the weight of the UAV, thereby reducing its payload or degrading its aerodynamic characteristics.

One of the problems addressed by some embodiments described herein is how to substantially increase the endurance of a UAV (e.g., a small battery-powered or fuel cell powered UAV such as the RAVEN or a HALE UAV) without substantially increasing its size or weight. Some embodiments address this problem by providing a kit to equip a UAV with lightweight, flexible, high efficiency solar cells (e.g., one or more solar cell strings or sheets of solar cells) that supply additional power to the UAV, thereby significantly increasing the endurance of the UAV as compared to a UAV without solar cells. Other embodiments address this problem by providing one or more solar sheets to be installed on a UAV either after the UAV has been produced or during production. Because the solar cells have relatively small mass per unit area, they do not add significant weight to the UAV. In some embodiments, the solar cells have a high specific power (power to mass ratio) providing significant power generation for relatively little added weight. For both small UAVs (e.g., portable UAVs that may be transported or deployed by a single person in the field) and HALE UAVs it is particularly important that the solar cells do not significantly increase the overall weight of the UAV, which could degrade the aerodynamic performance of the UAV and decrease its endurance.

For solar powered UAVs, a payload capacity of the UAV can be increased by replacing solar cells currently used in the UAV with solar cells or solar sheets capable of generating more power per unit mass of the solar cell or solar sheet. Some solar powered UAVs that incorporate higher specific power solar cells or higher specific power solar sheets can have increased endurance. Higher specific power solar cells and higher specific power solar sheets may enable more solar cells and solar sheets to be incorporated into a UAV without significantly increasing the weight of the UAV.

Definitions

As used herein, the term small UAV includes portable UAVs that may be carried by a single person. The term small UAV includes what may be referred to elsewhere as micro UAVs and mini UAVs and larger portable UAVs. Examples of small UAVs include the RQ-11B RAVEN UAV system with a weight of 1.9 kg and a wingspan of 1.4 m, the WASP Micro Air Vehicle (MAV) with a weight of 0.43 kg and a wingspan of 72 cm, and the RQ-20A PUMA with a weight of 5.9 kg and a wingspan of 2.8 m, the MAVERIC UAV with a 72 cm in wingspan and a loaded weight of about 1.1 kg, and the SCANEAGLE with a 3.1 m wingspan and an 18 kg.

As used herein, the term HALE UAV refers to an aircraft that functions at high altitude (i.e., greater than 30,000 feet or 9,000 meters) and is capable of flights which last for considerable periods of time (e.g., longer than 18 hours) without recourse to landing, which includes, but is not limited to the GLOBAL HAWK, ALTUS II, PHANTOM EYE, and ZEPHYR UAVs.

As used herein, the term areal mass refers to mass per unit area. For example, the areal mass of a solar cell is the mass of solar cell per unit area of the solar cell. As another example, the areal mass of a solar sheet is the mass of solar sheet per unit area of the solar sheet.

As used herein, the term areal power refers to power produced per unit area. For example, the areal power of a solar cell is the power produced by the solar cell under a specified illumination divided by the area of the solar cell. As another example, the areal power of a solar sheet is the power produced by the solar sheet under a specified illumination divided by the area of the solar sheet.

As used herein, the term specific power refers to the power produced per unit mass. For example, the specific power of a solar cell is the power produced by the solar cell under a specified illumination divided by the mass of the solar cell. As another example, the specific power of a solar sheet is the power produced by the solar sheet under a specified illumination divided by the mass of the solar sheet. The specific power can also be defined as the areal power divided by areal mass.

As used herein, the term solar sheet refers to a plurality of solar cells and one or more polymer layers to which the solar cells are affixed or attached. The solar sheet can also include interconnects that electrically connect at least some of the plurality of solar cells. The solar sheet can also include an adhesive that adheres the solar cells to the one or more polymer layers. The solar sheet can also include an adhesive to adhere the solar sheet to an underlying surface (e.g., a surface of a component of an UAV to which the solar sheet is to be attached). The solar sheet can be flexible to conform to an underlying rounded surface (e.g., the surface of a wing or the surface of a fuselage of a UAV).

Some embodiments described herein are broadly applicable to different sizes and different types of electrically-powered UAVs. Some embodiments described herein are directed to small battery-powered or fuel cell powered UAVs. Some embodiments described herein are applicable to HALE UAVs.

In some embodiments, a kit including a plurality of solar cells (e.g., one or more strings of solar cells ("solar cell strings") or one or more sheets of solar cells ("solar sheets")) and a power conditioning system is used to increase endurance of a UAV. For example, FIG. 1 schematically depicts solar sheets 30, 32, 34, 36 of a kit mounted on a UAV 10 that includes a battery power system. As shown, high efficiency flexible solar sheets 30, 32, 34, 36 have been mounted on a surface of the UAV (e.g., the wing 12 of the UAV). The kit also includes a power conditioning system configured to operate the solar cells within a desired power range or at a maximum power point and configured to provide a specified voltage to an electrical system of the UAV (see FIGS. 5-7 below). The power conditioning system may also be configured to charge an energy storage device (e.g., battery) of the UAV system (see FIG. 7 below).

In some embodiments, the plurality of solar cells (e.g., one or more solar cell strings or solar sheets) may be installed on a surface of a previously-produced UAV (e.g., as a post-manufacturing modification). For example, solar sheets of a kit may be applied to the wings of a previously-produced UAV. The power conditioning system and associated electrical wiring may be installed in the wings and fuselage of the previously-produced UAV and interfaced with the existing electrical system of the previously-produced UAV. In some embodiments, the kit may be an upgrade, a retrofit, or an aftermarket kit for installation on a previously-produced UAV.

In some embodiments, the plurality of solar cells (e.g., solar sheet(s)) may be mounted on or incorporated into a surface of a component of a UAV. The power conditioning system and associated electrical wiring (e.g., electrical harness) and connectors of the kit may be installed in the component. For example, FIG. 2 illustrates solar sheets 30, 32, 34, 36, each including multiple solar cells 30aa-30df, 32aa-32bc, 34aa-34fc, 36aa-36df, incorporated into a wing component 12 forming a wing assembly 13.

In some embodiments, the component with the solar sheet(s) (e.g., wing assembly 13) is used to replace a similar component in a previously-produced UAV as a post-manufacturing modification (e.g., as a retrofit or as an aftermarket modification). For example, a wing assembly including an installed kit may be used to replace a wing component in a previously-produced UAV.

In some embodiments, the component with the solar sheets (e.g., the wing assembly) is used during an initial manufacturing process of a UAV (e.g., as an upgrade). For example, a wing assembly with an installed kit may be incorporated into a UAV during initial manufacturing or assembly of the UAV as opposed to adding the solar cells and/or the power conditioning system to a previously-produced UAV.

Some embodiments may include an upgrade kit, a retrofit kit, or an aftermarket kit, for existing UAVs, such as the RAVEN UAV, the Wasp III UAV, the PUMA AE UAV, the MAVERIC UAS, GLOBAL HAWK, ALTUS II, PHANTOM EYE, and ZEPHYR. Different embodiments of kits can be used with different types or different models of UAVs.

In some embodiments, solar sheets are provided that are configured to adhere to a surface of a portion of a UAV. In some embodiments, the solar sheets are configured to connect to a power conditioning system included in the UAV instead of being provided in a kit with a power conditioning.

In some embodiments, the UAV may be designed with parts and connections configured for the incorporation of flexible, light weight, high efficiency solar cells or flexible, light weight, high specific power solar sheets. Incorporation of the solar cells or solar sheets into the UAV design may result in better aerodynamics, more robust electrical connections, and reduced additional weight to due to the solar cells, packaging and wiring harness. Some embodiments include UAVs specifically designed for hybrid battery/solar operation, such as UAVs that are primarily battery powered with a secondary solar power system including flexible, lightweight, high-efficiency solar cells. Some embodiments include electric UAVs whose primary power source is solar and that include one or more rechargeable batteries or fuel cells.

In some embodiments, solar sheets are provided that are configured to adhere to a surface of a portion of a UAV. In some embodiments, the solar sheets are configured to connect to a power conditioning system included in the UAV instead of being provided in a kit with a power conditioning. In some embodiments, the solar cells or solar sheets are used with a UAV that was designed to have solar power as its primary power source or run exclusively on solar power (e.g., the ZEPHYR HALE UAV).

In the embodiments depicted in FIGS. 1 and 2, the plurality of solar cells is incorporated into four solar sheets. In other embodiments, the plurality of solar cells may be incorporated into less than four solar sheets (e.g., one, two or three solar sheets) or may be incorporated into more than four solar sheets. In some embodiments, the kit includes one or more solar sheets and one or more strings of solar cells or individual solar cells not incorporated into solar sheets. In some embodiments all of the plurality of solar cells are in the form of strings of solar cells or individual solar cells and not incorporated into solar sheets. Generally the number of solar sheets to be installed on a UAV or included in a kit for a UAV depends on various factors, (e.g., size of the UAV, size of each solar sheets, how many solar cells are incorporated into each solar sheet). In some embodiments, the number of solar cells used on a UAV can be 100, 200, 300, 400, 500, 600, 700, 800, 900, or about 1000. In some embodiments, the number of solar cells used on a UAV can be 1,000, 2,000, 3,000, 4,000, 5,000, 6,000, 7,000, 8,000, or about 9,000. In some embodiments, the number of solar sheets used on a UAV can be more than 10,000. In some embodiments, the number of solar sheets used on a HALE UAV falls in a range of 100 to 1,000 solar sheets, 100 to 1,500 solar sheets, or 1,000 to 10,000 solar sheets.

In the embodiment depicted in FIGS. 1 and 2 the solar cells are positioned close to a leading edge 12*a* of the wing with areas near the trailing edge 12*b* of the wing not covered by solar cells. In this particular embodiment, the center space near the trailing edge of the wing was left uncovered to avoid blocking reception of an internal antenna of the UAV. In other embodiments, additional solar cells could be mounted in the areas near the trailing edge 12*b* of the wing (e.g., by incorporating more solar cells into sheets 30 and 36 or by adding additional solar sheets) to increase the amount of solar power generated and thereby further enhance UAV endurance.

In the embodiments of FIGS. 1 and 2, the solar sheets are mounted on an upper surface of the wing 12. In some embodiments, solar cells (e.g., one or more solar sheets) are applied to other surfaces of the UAV or to other components of the UAV, including, but not limited to, one or more of: the horizontal stabilizer, the vertical stabilizer, the fuselage, and the underside of the wings. Solar cells on the sides and underside of the UAV collect light scattered from the ground as well as from the sun and sky.

The plurality of solar cells may be single-junction solar cells, multi-junction solar cells (e.g., double-junction solar cells, triple junction solar cells) or any combination of single-junction solar cells and multi-junction solar cells. Although triple junction solar cells generally have a higher efficiency than that of single junction or double-junction solar cells, triple junction solar cells are generally more complicated to produce and may have a narrower wavelength range for high efficiency performance. The efficiency of the dual-junction and single-junction cells is less sensitive to the spectrum of the incident light than that of a triple-junction cell, so more energy may be obtained from dual-junction or single-junction cells when the cells are exposed to scattered light, rather than to direct sunlight. Accordingly, in some embodiments it may be desirable to use dual-junction or single-junction cells on the underside of the wings or the fuselage where the ratio of scattered light to direct sunlight is greater than for a top side of the wings.

The solar cells, and any solar sheets into which the solar cells are incorporated, must be flexible to conform to an underlying curved aerodynamic shape of a surface of UAV or of a UAV component onto which they will be mounted or into which they will be incorporated. Solar cells for a small UAV may need to be more flexible than solar cells for a large UAV due to the higher curvatures present in surfaces of small UAVs. Further, flexible solar cells are more durable than similar non-flexible or less flexible (i.e., more brittle) solar cells during installation, and during use.

As noted above, the solar cells and the solar sheets that include the solar cells should have a total mass that is relatively small compared to the mass of the UAV and should have a relatively low mass per unit area. This criterion is more difficult to meet for small UAVs than for large UAVs because the total mass of the small UAVs is relatively small.

Because additional mass tends to increase the power required to operate a UAV, the power supplied by the solar cells must more than compensate for the increase in the UAV mass due to the presence of the solar cells or solar sheets into which the solar cells are incorporated to increase endurance of a UAV. Thus, only solar cells having sufficient specific power (power per unit mass) would increase the endurance of a UAV.

For UAVs that is designed to incorporated solar cells and solar sheets using higher specific power solar cells or higher specific power solar sheets can increase the payload capacity of the UAV by increasing the available power for a given mass of solar cells or solar sheets incorporated into the UAV. Using higher specific power solar cells or higher specific power sheet may reduce the mass of solar cells or solar sheets incorporated into the UAV to generate a given power.

For a given solar cell, the efficiency for one spectrum of light is generally different than the efficiency for another spectrum of light. Parameters which depend on the efficiency of the solar cell can be specified for different types of illumination. For example, the specific power of solar cells or solar sheets can be specified under air mass coefficient 1.5 (AM1.5) light which is typically used to characterize low altitude or terrestrial based solar cells. The specific power of solar cells or solar sheets can alternatively or additionally be specified under air mass coefficient 0 (AM0) light, which corresponds to high altitude conditions or light condition outside the atmosphere.

Figure 16:
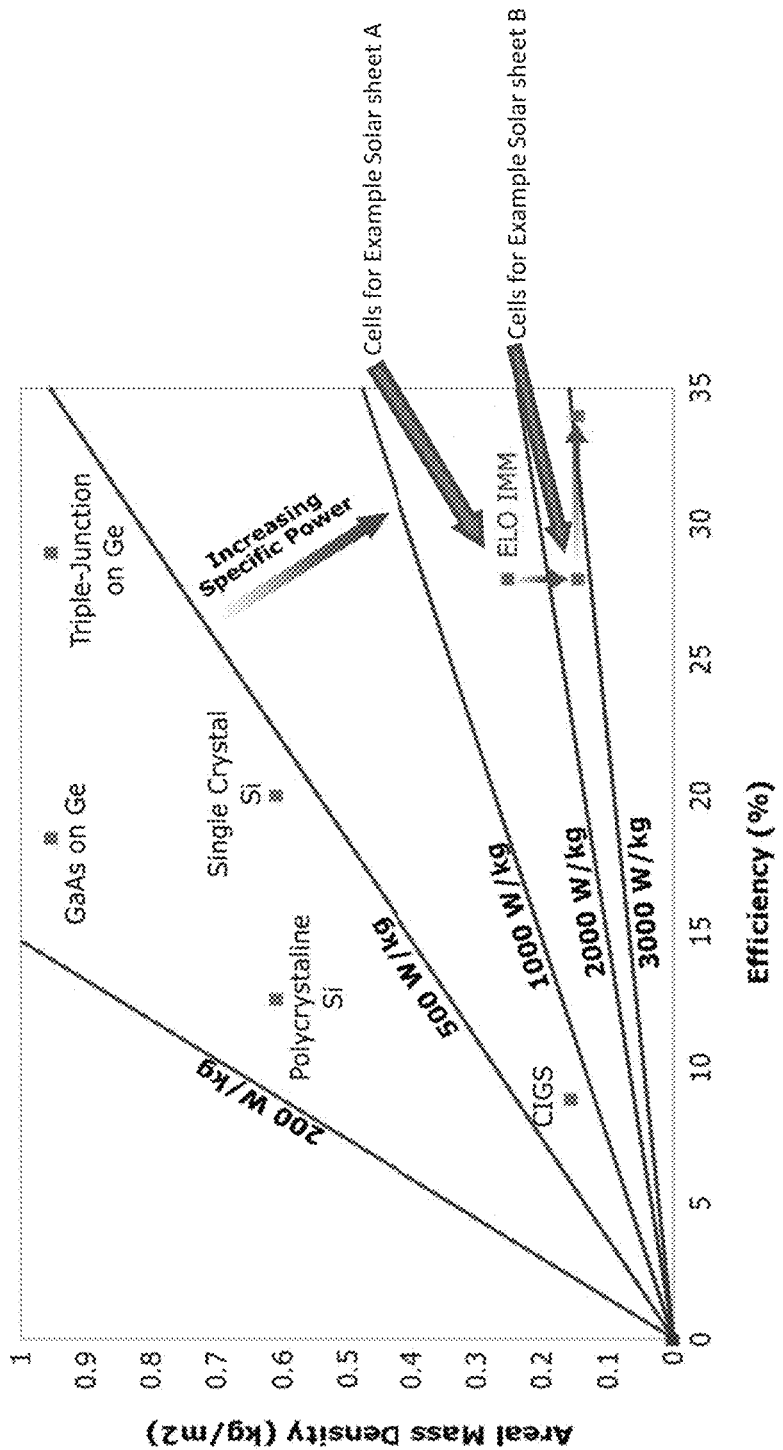
FIG. 16 is a graph of areal power and efficiency of various commercially available solar cells and those used in some example solar sheets as taught herein.

FIG. 16 is a graph showing how increasing the efficiency of solar cells and decreasing the areal mass of solar cells relates to an increase in specific power of the solar cells. Various types of commercially available solar cells as well as ELO IMM triple-junction ((Al)InGaP/GaAs/InGaAs) solar cells made by the inventors are included in the graph of FIG. 16. "Al" is included in parentheses in the listing of the triple-junction solar cell to indicate that in some embodiments included aluminum was included in the first junction (e.g., AlInGaP/GaAs/InGaAs) and in some embodiments aluminum was not included in the first junction (e.g., InGaP/GaAs/InGaAs) depending on the application or use. For example, the triple-junction InGaP/GaAs/InGaAs solar cell performs well under AM1.5. But, under AM0, AlInGaP/GaAs/InGaAs can be used because the Al can help the first junction to be better tuned to the high UV content of AM0 as compared to AM1.5.

The commercially available solar cells include single-junction polycrystalline silicon solar cells, single-junction single crystal silicon solar cells, triple junction gallium arsenide solar cells on germanium, triple-junction solar cells on germanium, and single-junction copper-indium-gallium-selenide (CIGS) solar cells. Both polycrystalline silicon solar cells and single crystal silicon solar cells are rigid solar cells, (i.e., not flexible solar cells). CIGS solar cells are grown on glass, polymers and metal sheets. CIGS solar cells are flexible, but they typically have a lower efficiency compared to silicon or GaAs-based solar cells. The GaAs solar cells, which are grown on the Ge substrate, are both rigid and fragile; however, due to their high efficiency, they are often used for space solar arrays. As shown in FIG. 16 the inventors' ELO IMM triple junction solar cells have higher specific power than the comparison commercially available solar cells. Further details regarding the ELO IMM solar cells are provided below in Examples 2-4 with respect to the discussion of the solar cells used in example solar sheet A and example solar sheet B.

In some embodiments, a specific power of the plurality of solar cells is at least a threshold value (e.g., at least 1000 W/kg, at least 1500 W/kg, at least 2000 W/kg, at least 2500 W/kg, for AM1.5). The threshold value may alternatively, or additionally be specified with respect to AM0 (e.g., at least 1220 W/kg, at least 1870 W/kg, at least 2520 W/kg, or at least 3150 W/kg, under AM0). In some embodiments, the specific power of the solar cells falls within a specified range (e.g., 1000-4500 W/kg, 1500-4500 W/kg, 2000-4500 W/kg, 2500-4500 W/kg, or 1500-6000 W/kg under AM1.5). The range may alternatively, or additionally, be specified with respect to AM0 light (e.g., 1220-5680 W/kg, 1870-5680 W/kg, 2520-5680 W/kg, 3150-5680 W/kg, or at least 1870-7000 W/kg, under AM0).

The specific power of a solar cell depends on the efficiency of the solar cell (electrical energy produced divided by solar energy absorbed for a unit area of the solar cell) and the mass per unit area of the solar cell (i.e., the areal mass). Thus, a solar cell with a relatively high specific power has a relatively high efficiency and/or a relatively low areal mass. Solar cells free of a substrate (e.g., solar cells produced using epitaxial lift off (ELO)) may be particularly well suited for use on a UAV because they have a reduced mass per unit area and greater flexibility as compared to solar cells attached to an underlying substrate.

In general, if the materials of a solar cell remain the same, decreasing the thickness of the solar cell increases the flexibility of the solar cell. As noted above, increased flexibility allows the solar cell to conform to an aerodynamic shape of a UAV surface or of the surface of a UAV component and increases the durability of the solar cell. In some embodiments, each solar cell may have a thickness of less than a specified thickness (e.g., less than 40 µm, less than 25 µm, less than 13 µm, or less than 5 µm). In some embodiments, each solar cell may have a thickness that falls in a specified range (e.g., 2-40 µm, 2-30 µm, 2-15 µm).

The areal mass of a solar cell is independent of the light spectrum used for power generation (i.e., AM1.5 or AM0). In some embodiments, the areal mass of a solar cell may have a value that falls in a specified range (e.g., 70-280 g/m$^2$, 165-250 g/m$^2$, 95-165 g/m$^2$, 70-95 g/m$^2$). The areal mass of the solar cell can be reduced by reducing the mass of one or more components of the of solar cell without reducing the area of the solar cell. For example, for solar cells that include a backing layer, such as ELO IMM solar cells including a backing layer, reducing the thickness of the backing layer of the solar cell can reduce the areal mass of the solar cell. In some embodiments, the solar cell includes a metal backing layer. In some embodiments, the metal backing layer may have a thickness of less than a specified thickness (e.g., less than 30 µm, less than 15 µm, or less than 5 µm).

Areal power of a solar cell is dependent on the efficiency of the solar cell. The areal power of a solar cell is greater under AM0 than under AM1.5. This is due to the fact that AM0 light inherently has more power to begin with because, unlike the AM1.5 light, the AM0 light has not been filtered by atmospheric conditions. In some embodiments, the efficiency of the solar cells under AM0 varies by 2.5% from efficiency of the solar cells under AM1.5. For example, if the solar cell has 25% efficiency under AM0, it has about 27.5% efficiency under AM1.5. In some embodiments, the solar cell has 29% efficiency under AM1.5 which results in an areal power of 290 W/m$^2$ under AM1.5, and the solar has 26.5% efficiency under AM0 which results in an areal power of 360 W/m$^2$ under AM0. In another embodiment, the efficiency of the solar cell can increase to 30% under AM0 resulting in an areal power of 410 W/m$^2$ under AM0 and as a result, the efficiency of the solar cell can increase to 32.5% under AM1.5 resulting in an areal power of 325 W/m$^2$ under AM1.5.

In some embodiments, the areal power of the solar cell may be in the range of 260-360 W/m$^2$ under AM1.5. In some embodiments, the areal power of the solar cell may be in the range of 325-450 W/m$^2$ under AM0.

As noted above, at least some of a plurality of solar cells may be incorporated into a flexible solar sheet. For example, in some embodiments, lightweight solar cells (or strings of solar cells) are disposed under a polymer film or between polymer films to form flexible solar sheets to aid in easier handling and installation, and to provide greater protection of the solar cells. The flexible solar sheets conform to curved aerodynamic surfaces. In some embodiments the flexible solar sheets provide robust waterproof packaging. The flexible solar sheets may be applied to or incorporated into a surface of a UAV or of a component of a UAV.

Figure 4:
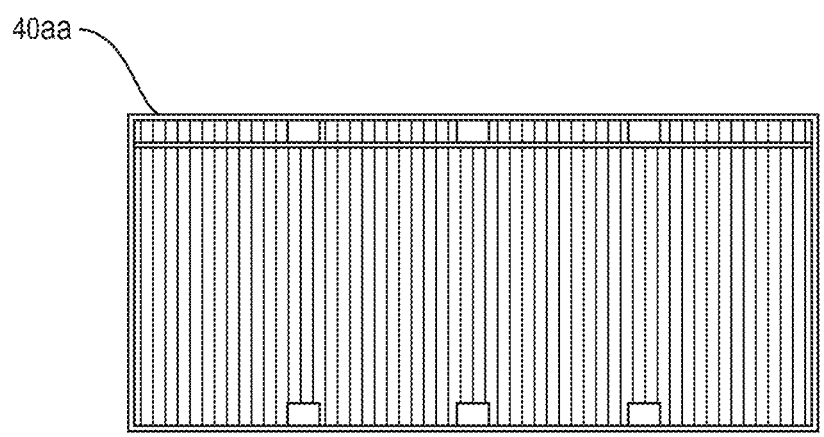
FIG. 4 schematically depicts a plan view of an exemplary solar cell, in accordance with an embodiment.

FIG. 3 illustrates the flexibility of a solar sheet 40, in accordance with an embodiment. FIG. 4 illustrates a plan view of a single solar cell 40*aa*. The flexible solar sheet may also include electrical components such as electrical interconnections between solar cells or electrical leads. As shown in FIG. 3, within a solar sheet 40 multiple solar cells may be electrically connected in columns and/or rows (e.g., cells 40*aa*-40*da* are connected in a solar cell string, cells 40*ad*-40*dd* are connected in a solar cell string). As also shown in FIG. 3, a solar sheet may include components for making electrical connections to the solar sheet (e.g., leads 42a1, 42a2 associated with one column, leads 42d1, 42d2 associated with another column and ground connections 44a and 44c).

Due to added mass of polymer materials in solar sheets, a solar sheet of a plurality of solar cells has a lower specific power than the specific power of the solar cells themselves. Also, if the solar sheet has a top layer, the top layer may reduce the efficiency of the solar sheet (e.g., by absorbing some of the incident light before it reaches the solar cell). In some embodiments, a solar sheet has a specific power of at least a specified value (e.g., at least 800 W/kg, or at least 1000 W/kg, under AM1.). Additionally or alternatively the threshold for specific power may be described in terms of AM0 light (e.g., at least 1020 W/kg, at least 1270 W/kg, under AM0). In some embodiments, a solar sheet has a specific power falling within a specified range (e.g., 800-2350 W/kg, 1000-2350 W/kg, 1000-3500 W/kg, under AM1.5). Additionally or alternatively the range for specific power may be described in terms of AM0 light (e.g., 1020-3000 W/kg, 1270-3000 W/kg, 1020-4000 W/kg, under AM0).

The areal mass of a solar sheet includes the encapsulating materials that form the solar sheet ready to be installed on a UAV. As noted above, decreasing the mass of solar sheet increases the specific power of the solar sheet. The main factor for reducing the areal mass of the solar sheet is the reduction in thickness of the encapsulating materials by substituting lighter materials and eliminating redundant materials. In some embodiments, the areal mass of the solar sheet may have a value that falls in a specified range (e.g., 120-570 $g/m^2$, 120-300 $g/m^2$, or, 120-160 $g/m^2$).

The areal power of a solar sheet is dependent on the efficiency of the solar cells in the solar sheet as well as how tightly the solar cells are packed together in an array in a solar sheet. One way to increase the areal power of the solar sheet is by reducing or minimizing the spacing or the lateral gaps between adjacent solar cells in the solar sheet. In one embodiment, the solar cells were spaced 2 mm or more from each other resulting in a sizable amount of area on the solar sheet that is was not active and did not contribute power to the whole solar sheet. The areal power of the solar sheet was measured to be 230 $W/m^2$ under AM1.5. In another embodiment, the solar cells were packed with less than 1 mm spacing between adjacent cells. The areal power of the solar sheet was measured to be 260 $W/m^2$ under AM1.5 and 330 $W/m^2$ under AM0.

The overall increase in mass of the UAV due to installation of a kit or due to installation of solar sheets should be small relative to the total weight of the UAV. For example, in some embodiments the installed kit or the installed solar sheets increase the weight of the UAV by less than 2%, by less than 5%, by less than 10%, by less than 15%, or by less than 20%. As noted above, this requirement may be more challenging for small UAVs than for large UAVs.

Solar cells for the kit or solar cells used with embodiments employing solar sheets may be based on any number of suitable semiconductor materials like III-V semiconductor materials (e.g., GaAs-based materials, InP-based materials, etc.) and Si-based materials. The solar cells may be single junction solar cells, multi-junction solar cells (e.g., double-junction, triple-junction), or a combination of single junction and multi-junction solar cells. In general, higher efficiencies can be obtained with multi-junction solar cells than with single junction solar cells, however, multi-junction solar cells are more complicated to make and can be more expensive. Examples of solar cells having relatively high efficiencies include triple junction inverted metamorphic (IMM) solar cells, which may be produced using ELO or using methods that do not employ ELO. As a specific example, triple junction IMM solar cells with an (Al)InGaP/GaAs/InGaAs grown inverted on GaAs by the inventors demonstrated efficiencies of greater than 29% under AM0.

Further information regarding III-V semiconductor solar cells produced by ELO (e.g., single junction, multi-junction and IMM solar cells), and how to manufacture III-V semiconductor ELO solar cells may be found in U.S. Pat. No. 7,994,419 to Pan et al. issued Aug. 9, 2011, which is incorporated by reference herein in its entirety. Further information regarding InP-based solar cells produced by ELO (single junction, multi-junction and IMM) and how to manufacture InP-based ELO solar cells may be found in U.S. patent application Ser. No. 13/631,533, filed Sep. 28, 2012, which is incorporated by reference herein in its entirety.

Figure 5:
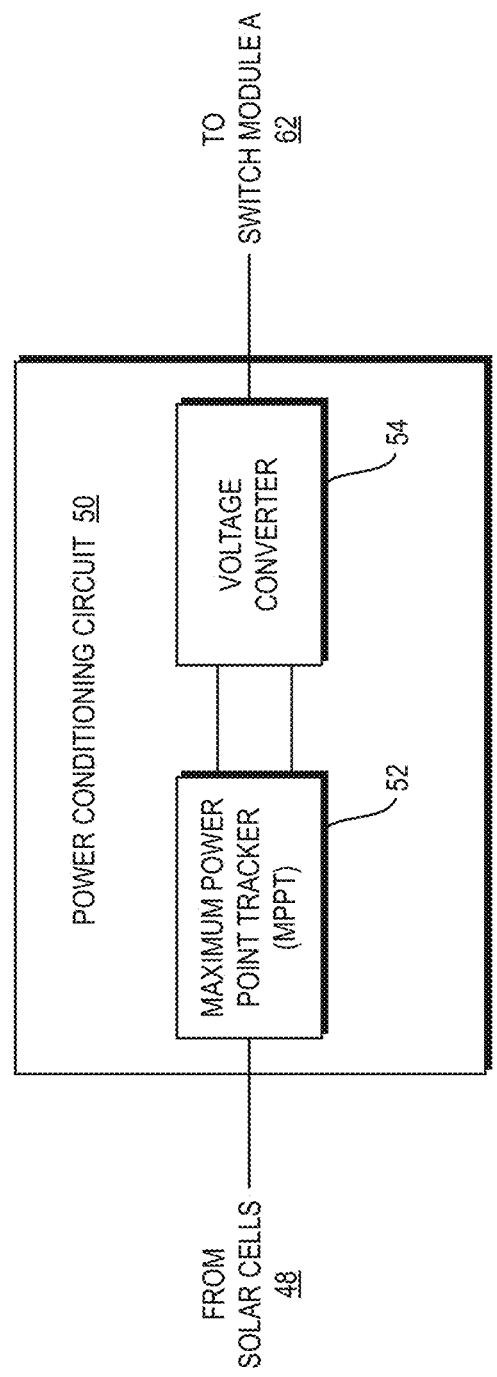
FIG. 5 is a block diagram of a power conditioning circuit (PCC) in accordance with an embodiment.

For embodiments that include a kit, the kit includes a power conditioning system configured to operate the plurality of solar cells within a desired power range and configured to provide a specified voltage to an electrical system of the UAV. FIG. 5 is a block diagram of a power conditioning circuit 50 included in the power conditioning system in accordance with some embodiments. The power conditioning circuit 50 includes a maximum power point tracker (MPPT) 52 connected with the solar cells. The MPPT 52 is configured to operate the solar cells within a desired power range. Any type of suitable MPPT component or circuit may be employed. The power conditioning circuit also includes a voltage converter 54 that converts voltage from the MPPT into a voltage compatible with the electrical system of the UAV. Any suitable voltage conversion component or circuit may be employed (e.g., a buck voltage converter (DC to DC voltage reduction), a boost voltage converter (DC to DC voltage increase)). In this embodiment, the voltage converter 54 is connected to an electrical system of the UAV through a switch (switch A 62).

In some embodiments, the power conditioning system may also be configured to charge an energy storage device (e.g., a battery, fuel cell) of the UAV. FIGS. 6 and 7 are block diagrams representing a power conditioning system 60 configured to charge an energy storage device of the UAV in accordance with some embodiments. Power conditioning system 60 includes the power conditioning circuit 50 and switch module A 62, which connects with the UAV electrical system 70. As shown, power conditioning system 60 may also include a charging module 64 and a switch module B 66 that connect with an energy storage element 72 (e.g., a battery, fuel cell) of the UAV.

In FIG. 6, the system is operating in a first mode in which the solar cells 48 supply just a portion of the power being used by the UAV electrical system 70. In this mode, through switch module B, the energy storage device 72 (e.g., battery, fuel cell) supplements the power supplied by the solar cells for the UAV's electrical system 70. As indicated by arrows, the charging module 64 is bypassed in this mode. In FIG. 7, the system is operating in a second mode in which the power supplied by the solar cells 48 exceeds the power being used by the UAV electrical system 70 and the excess generated power is directed through the charging module 54 and switch module B 66 to charge the energy storage 72 (e.g., battery, fuel cell). A third mode of operation in which the power supplied by the solar cells exactly matches the power used by the electrical system is not depicted because, generally speaking, the third mode only occurs when shifting from the first mode to the second mode and vice-versa). In some embodiments, a UAV incorporating a secondary solar power system could be charged with exposure to sunlight before flight as well as during flight.

Electrical connections (e.g., power bus lines, wiring harness) connecting the solar cells, the power conditioning system, the electrical system of the UAV and the energy storage device (e.g., battery, fuel cell) of the UAV may be integrated into one or more components of the UAV (e.g., the wings or the fuselage).

Figure 8:
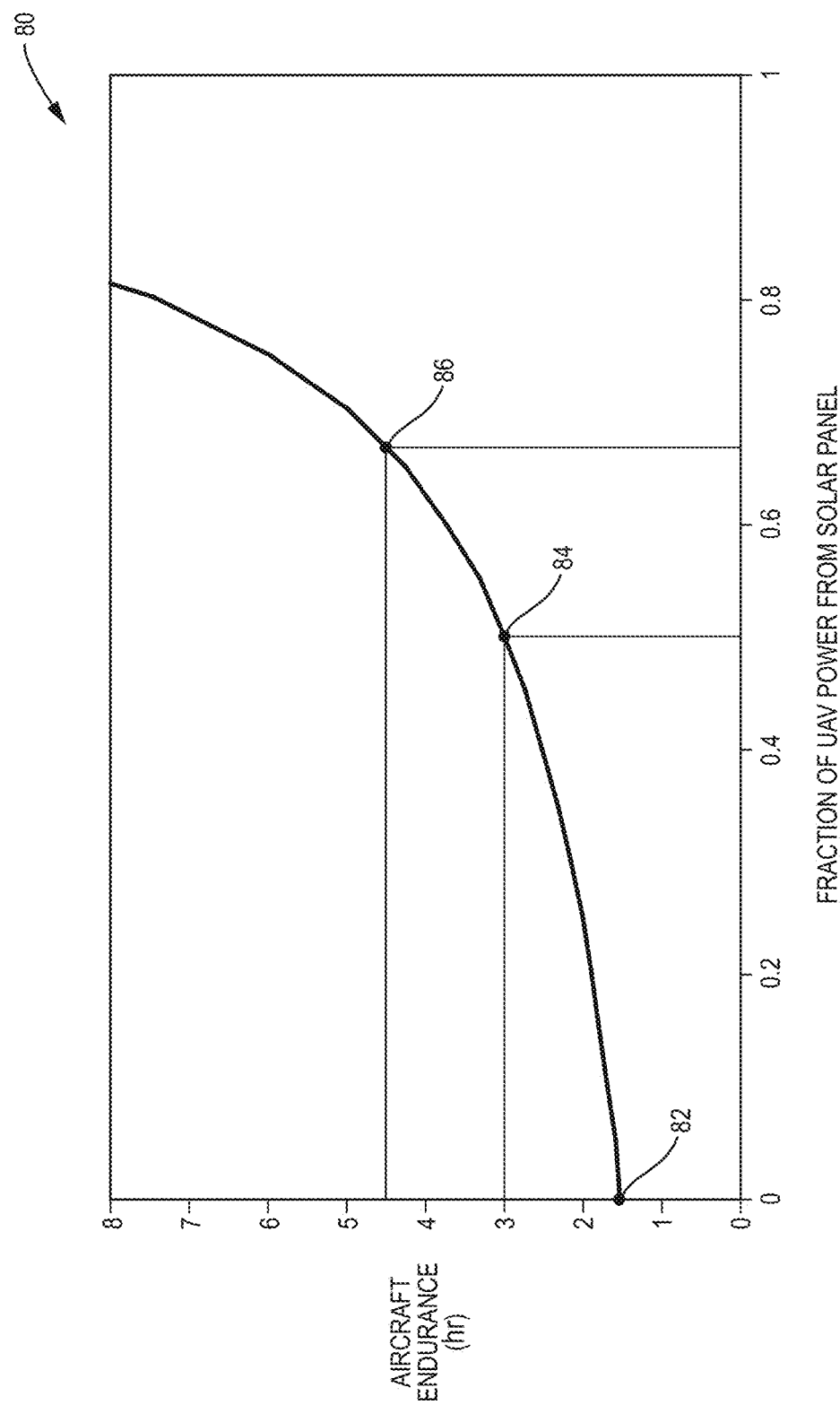
FIG. 8 is a graph representing UAV endurance as a function of the fraction of the UAV power from solar cells for a theoretical model.

FIG. 8 is a theoretical graph 80 of the endurance (total flight time) of a generic small UAV as a function of the fraction of the average UAV power consumption that is provided by the solar cells. Note that the endurance enhancement is not a linear function of power provided by the solar panels. Instead, the marginal endurance enhancement provided by a given solar cell capacity increases as the overall fraction of the UAV power provided by the solar panel increases. For example, for a UAV having an endurance of 1.5 hours without solar enhancement (point 82), the graph shows that endurance is doubled to 3 hours (i.e., a 100% increase) by providing 50% of the average power from the solar cells (point 84). A further 1.5 hr enhancement to 4.5 hr is achieved by supplying only an additional 17% of the average power consumption from the solar cells (point 86). Note that the model assumes sufficient available light. For example, for times greater than 8 hours, the aircraft endurance is limited practically due to the available hours of sunlight in a day, which is not shown in the model.

Some embodiments increase an endurance of a UAV by at least 50%, by at least 80%, by at least 100%, by at least 150%, or by at least 200% as compared to a similar UAV that is only battery-powered or fuel cell powered. In some embodiments, the kit is configured to supply, when installed, 40-99% of the total average power during use.

Some embodiments include methods of increasing an endurance of a battery-powered or fuel cell powered UAV. For example, in method 100 of FIG. 9, a component that includes a plurality of solar cells is provided for a UAV (step 102). In some embodiments the component is at least a portion of a wing for a UAV. A power conditioning system configured to operate the plurality of solar cells within a desired power range and configured to provide power in the form of a voltage compatible with an electrical system of a UAV is provided (step 104). The component is installed in a UAV (step 106). In some embodiments the provided component replaces a previously-produced component of a previously-produced UAV. In some embodiments, the component is installed in the UAV during manufacturing of the UAV. The power conditioning system is connected with an electrical system of the UAV (step 108).

Method 110 of FIG. 10 depicts another method of increasing an endurance of a battery-powered or fuel cell powered UAV. A plurality of solar cells is attached to a surface of a battery-powered or fuel cell powered UAV (step 112). The plurality of solar cells may be attached to a surface of a wing of the UAV. In some embodiments the solar cells are attached to a surface of a previously-produced UAV. In some embodiments, the solar cells are attached during initial production of the UAV. A power conditioning system configured to operate the plurality of solar cells within a desired power range and configured to provide power in the form of a voltage compatible with an electrical system of the UAV is provided (step 114). The power conditioning system is connected with the electrical system of the UAV (step 116).

Some embodiments include a solar sheet configured for installation on a component of a UAV. The solar cell may be included in a kit with a power conditioning system or may be provided without a power conditioning system. FIG. 17A schematically depicts a side cross-sectional view of a solar sheet 90 for installation on a component of a UAV in accordance with an embodiment. FIG. 17B is a detail of FIG. 17A. The solar sheet 90 includes a plurality of solar cells 94 each having a top surface 93 and a bottom surface 91. Solely for illustrative purposes, the cross-section of solar sheet 90 is depicted with three solar cells. In some embodiments, the solar sheet 90 may have more than three columns or more than three rows of solar cells. In some embodiments, the solar sheet may have less than three columns or less than three rows of solar cells. In FIGS. 17A and 17B interconnects between the solar cells are not shown for clarity. In some embodiments, each of the solar cells has a specific power in a range of 1500-4500 W/kg under AM1.5 or a specific power in a range of 1870-5680 W/kg under AM0. In some embodiments, each of the solar cells has a specific power in a range of 2000-4500 W/kg under AM1.5 or a specific power in a range of 2520-5680 W/kg under AM0. In some embodiments, each of the solar cells has a specific power in a range of 2500-4500 W/kg under AM1.5 or a specific power in a range of 3150-5680 W/kg under AM0.

The solar sheet 90 also includes a polymer layer 98 to which the plurality of solar cells 94 are attached. As depicted the polymer layer 98 is attached to the top surface 93 of the solar cells and may be described as a polymer top sheet. In some embodiments, the polymer layer 98 includes polytetrafluoroethylene, e.g., TEFLON from DuPont. In some embodiments, the thickness of the polymer layer 98 is in a range of 15 microns to 30 microns.

In some embodiments the solar sheet 90 includes a first adhesive layer 92. In some embodiments, the first adhesive layer 92 is configured to attach the solar sheet 90 to a component of a UAV. In some embodiments, the first adhesive layer 92 is in contact with a bottom surface 92 of each solar cell. The adhesive can be any suitable adhesive (e.g., NT 1001 pressure sensitive adhesive (PSA) from Forza Power Technologies). In some embodiments, the thickness of the first adhesive layer 92 is in a range of 8 microns to 15 microns. In some embodiments, the thickness of the first adhesive layer is in a range of 8 microns to 25 microns. In some embodiments, the bottom surface 91 of each of the solar cells 94 is in contact with the first adhesive layer 92.

In some embodiments the solar sheet 90 includes a second adhesive layer 96 that attaches the plurality of solar cells 94 to the polymer top sheet 98. In some embodiments, the second adhesive layer 96 is in contact with the top surface 93 of each of the plurality of solar cells 94. The second adhesive layer 96 can be any suitable adhesive (e.g. a PSA such as NT 1001). In some embodiments, the thickness of the second adhesive layer 92 is in a range of 8 microns to 15 microns. In some embodiments, the thickness of the second adhesive layer is in a range of 8 microns to 25 microns.

Figure 19A:
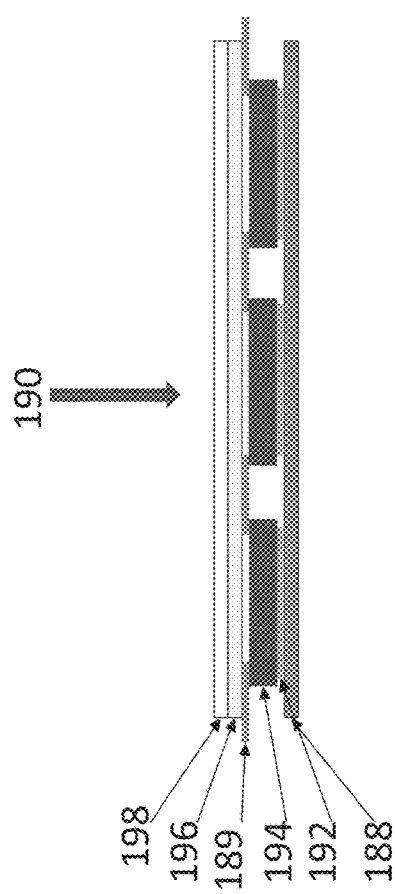
FIG. 19A schematically depicts a side cross-sectional view of an example solar sheet A, as taught herein.

Although solar sheet 90 depicted in FIG. 17A and FIG. 17B does not include a bottom polymer layer, in some other embodiments, the solar sheet includes a bottom polymer layer, which may be described at a polymer bottom sheet, underlying the first adhesive layer (see, e.g., FIG. 19A described below). In such embodiments, the first adhesive layer does attaches the bottom polymer layer to the other elements of the solar sheet, but is not configured attach the solar sheet to an underlying surface of a UAV. In some embodiments, a bottom polymer layer includes polyvinyl fluoride (PVF) e.g., a TEDLAR PVF film from DuPont.

In some embodiments, each of the plurality of solar cells in solar sheet has a specific power of at least a specified value (e.g., at least 1000 W/kg, at least 1500 W/kg, at least 2000 W/kg, at least 2500 W/kg, under AM1.5). The specific power of the solar cells in the solar sheet may additionally or alternatively be described in terms of AM0 light (e.g., at least 1270 W/kg, at least 1870 W/kg, at least 2520 W/kg, at least 3150 W/kg, under AM0). In some embodiments, each of the plurality of solar cells has a specific power falling within a specified range (e.g., 1000-4500 W/kg, 1500-4500 W/kg, 2000-4500 W/kg, 2500-4500 W/kg, 1500-6000 W/kg, under AM1.5). The specific power of the solar cells in the solar sheet may additionally or alternatively be described in terms of AM0 (e.g., 1270-5680 W/kg, 1870-5680 W/kg, 2520-5680 W/kg, 3150-5680 W/kg, 1870-7000 W/kg, under AM0).

In some embodiments the solar sheet has a specific power of at least a specified value (e.g., at least 400 W/kg, at least 800 W/kg, at least 1000 W/kg, under AM1.5). In some embodiments the solar sheet has a specific power falling with within a specified range (e.g., 400-2350 W/kg, 800-2350 W/kg, 1000-2350 W/kg, 1020-3000 W/kg, under AM1.5). The specific power of the solar sheets may additionally or alternatively be described in terms of AM0 (e.g., at least 510 W/kg, at least 1020 W/kg, at least 1270 W/kg or in a range of 10-3000 W/kg, 1020-3000 W/kg, 1270-3000 W/kg, 1020-4000 W/kg, under AM0).

As noted above, the areal mass of the solar sheet includes the encapsulating materials that form the solar sheet ready to be installed on a UAV. Decreasing the mass of solar sheet, increases the specific power of solar sheet. In some embodiments, the areal mass of the solar sheet may have a value that falls in a specified range (e.g., 70-280 g/m$^2$, 120-570 g/m$^2$, 120-300 g/m$^2$). The areal power of a solar sheet is dependent on the efficiency of the solar cells as well as how tightly the solar cells are packed together in an array. In some embodiments, the areal power of the solar sheet may have a value that falls in a specific range (e.g., 260-330 W/m$^2$, 200-330 W/m$^2$ under AM1.5 or 325-450 W/m$^2$, 260-410 W/m$^2$ under AM0).

In some embodiments, the solar sheet is configured to be attached to a wing of a UAV. In some embodiments, the solar sheet is a flexible solar sheet. In some embodiments the plurality of solar cells includes solar cells produced using an epitaxial lift-off process.

In some embodiments each of the plurality of solar cells includes a metal backing layer. In some embodiments, the thickness of the metal backing layer is less than 30 μm, less than 15 μm, or less than 5 μm. In some embodiments, the metal backing layer has a thickness in a range of 2 to 30 microns. In some embodiments, the metal backing layer has a thickness in a range of 2 to 15 microns.

Figure 18B:
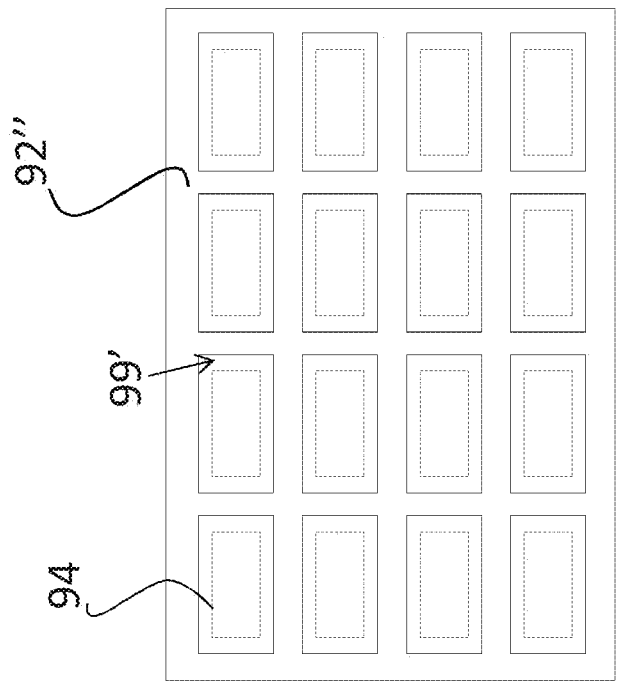
FIG. 18B schematically depicts a top view an adhesive layer that includes cutouts larger than corresponding solar cells, in accordance with some embodiments.
Figure 18A:
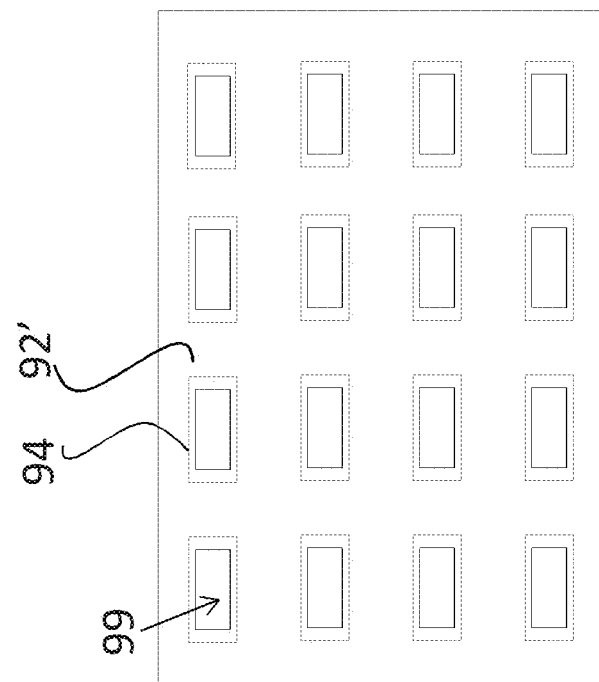
FIG. 18A schematically depicts a top view of an adhesive layer that includes cutouts smaller than corresponding solar cells, in accordance with some embodiments.

As noted above, in order to increase the specific power of the a solar sheet, the areal mass of the solar sheet can be decreased. For example, in some embodiments, portions of first adhesive layer of the solar sheet include cutouts to reduce the mass of the solar sheet. FIG. 18A schematically illustrates a top view of a first adhesive layer 92' that includes cutouts 99 with each cutout corresponding to a position of a solar cell 94. Although only the first adhesive layer is shown, for illustrative purposes the positions and areas of the corresponding solar cells in the solar sheet are indicated with dotted lines 94. In some embodiments, the area of each cutout 99 in the adhesive layer 92' is smaller than the area of the corresponding solar cell 94, as illustrated in FIG. 18A. In some embodiments, the area of each cutout 99' in an adhesive layer 92" is larger than the area of the corresponding solar cell 94, as illustrated in FIG. 18B. In some embodiments, the area of each cutout in an adhesive layer is about the same as the area of the corresponding solar cell. In such embodiments, a frame or window structure for the first adhesive layer provides sufficient adhesion to secure the solar sheet to an underlying component of the UAV while achieving a significant mass reduction.

In some embodiments, the second adhesive layer includes a plurality of cutouts, each corresponding to a position of a solar cell in the solar sheet. In some embodiment, both the first adhesive layer and the second adhesive layer include a plurality of cutouts, each corresponding to a position of a solar cell in the solar sheet.

EXAMPLES

Example 1—Kit Installed in Small UAV

The inventors installed an example kit including solar cells and a power conditioning circuit in a small, battery-powered or fuel cell powered UAV, specifically a RAVEN UAV. The modified UAV with the installed kit demonstrated a significant increase in endurance as compared with an identical UAV without the kit. A plurality of solar cells in the form of four solar sheets was integrated into a wing component of a battery-powered or fuel cell powered RAVEN UAV in the configuration shown in FIG. 2. The wing 12 modified to include a wiring harness that would supply solar power to the UAV battery and vehicle. The wing assembly including the solar sheets and associated electronics was installed on a previously-produced RAVEN UAV as shown in FIG. 1. Further details regarding the solar cells and the solar sheets employed are described below with respect to FIGS. 14 and 15.

Figure 11:
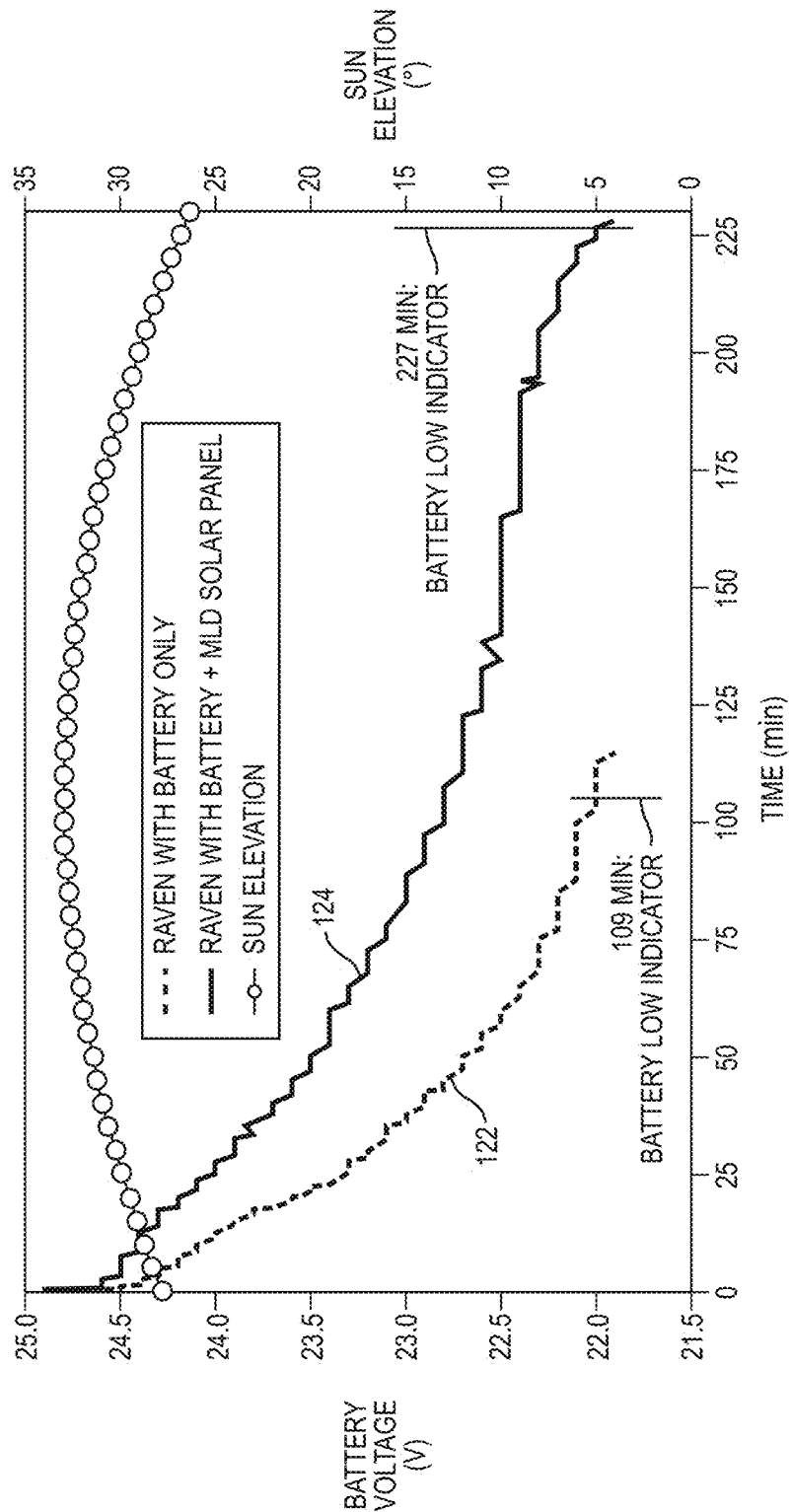
FIG. 11 is a graph of battery voltage as a function of time for a battery-only UAV and for a UAV supplemented with an example kit including solar cells with the UAVs at 50% throttle on the ground.
Figure 13:
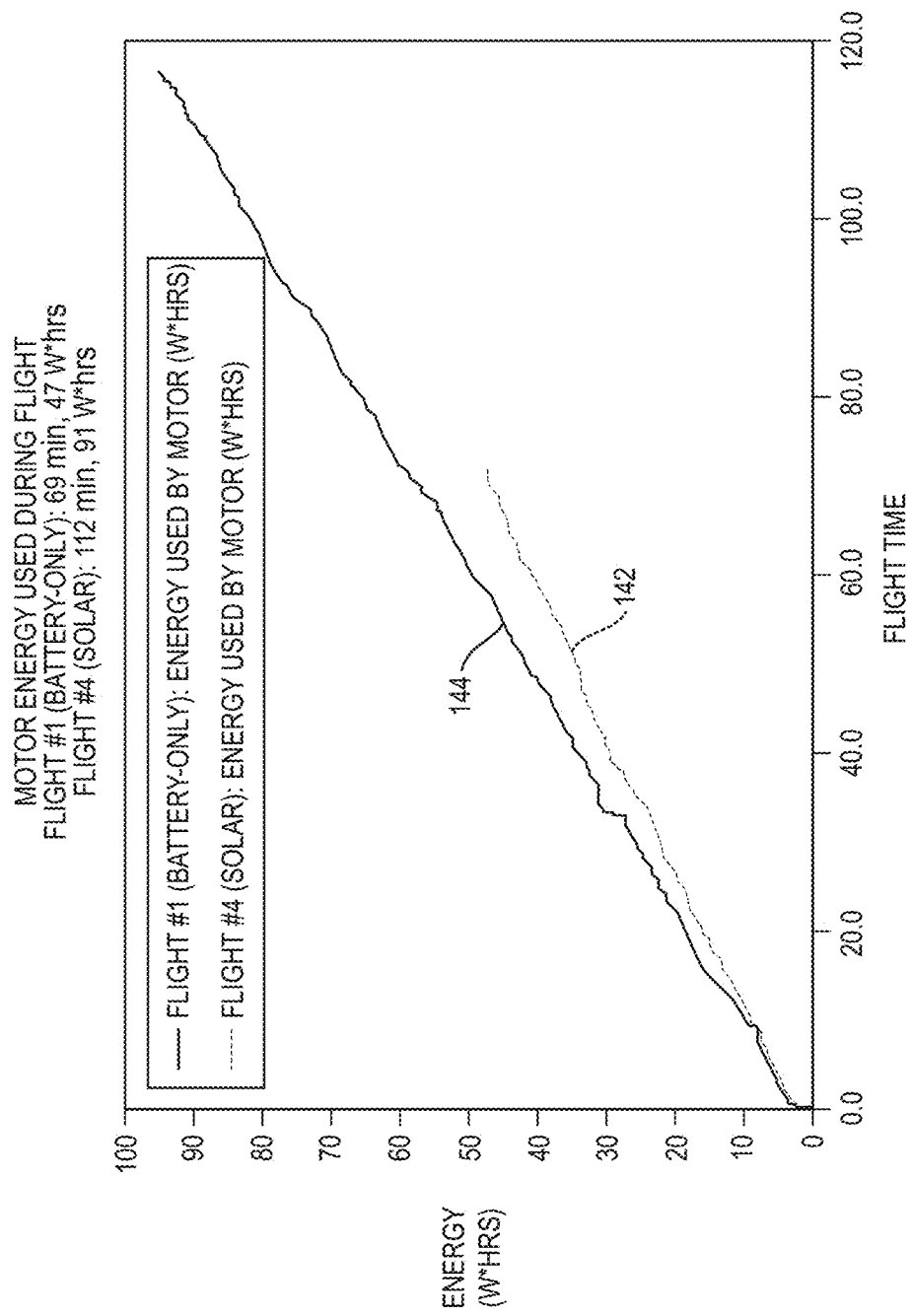
FIG. 13 is a graph of energy used by a motor as a function of time during flight for the battery-only UAV and for the UAV supplemented with the example kit.

FIG. 11 shows a comparison of the battery voltage of the modified (solar kit installed) UAV (124) and the battery voltage of the standard (battery-only) UAV (124). The UAVs were both operated at 50% throttle while sitting on a test stand until the battery voltage fell below the voltage at which the "Battery Low" indicator was activated (i.e., 22 V). The "endurance" was measured while the UAVs were stationary on the test stand as the time between starting the power of the UAV and the battery reaching 22 V. As shown in FIG. 13, the modified UAV with solar sheets had an "endurance" of 228 minutes as compared with an "endurance" of 109 minutes for the unmodified battery-only UAV, which was an increase of 109%. This data is not true flight "endurance" data because the UAVs were not in flight; however, the results established that the solar cells provided significant amounts of additional energy to the UAV.

Figure 12:
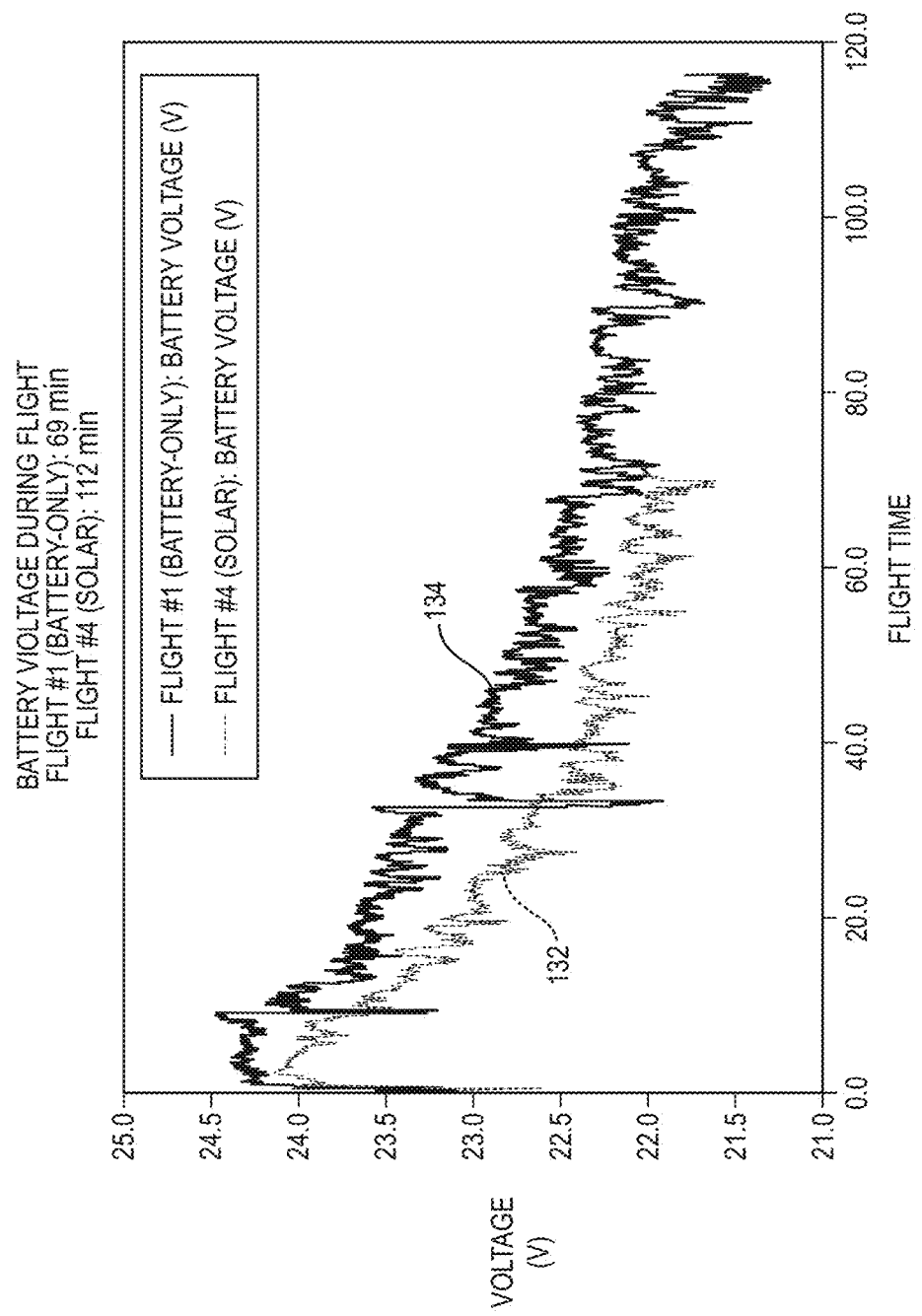
FIG. 12 is a graph of battery voltage as a function of time during flight for a battery-only UAV and for a UAV supplemented with an example kit including solar cells.

FIGS. 12 and 13 below show comparative data taken during flight tests. Another RAVEN UAV was modified in a similar manner and flight tests were conducted for the modified (solar kit installed) UAV as compared with an unmodified battery-only UAV. FIG. 12 shows a comparison of the battery voltage of the modified (solar kit installed) UAV (134) and the battery voltage of the standard (battery-only) UAV (132) during flight. The endurance was measured as the time between takeoff of the UAV and the battery reaching 22 V. As shown in FIG. 12, in the standard, battery-only configuration (F132) the UAV operated for 69 minutes before the battery voltage dropped to 22 V. When retrofitted with wings integrated with solar sheet technology (134), the UAV operated for 112 minutes before the battery voltage dropped to 22 V, which is an increase in endurance of 62%.

FIG. 13 shows the total energy used by the UAV motor during flight for the standard battery-only UAV (142) and for the modified UAV with solar sheets (144). The total energy usage for the UAV motor was 47 W-hrs for the standard UAV (142) and 91 W-hrs for the modified UAV with solar sheets (422). Thus, the solar sheets provided an additional 44 W-hrs of energy to the motor of the UAV.

The solar cells used in the solar sheets installed on the UAVs were triple-junction AlInGaP/GaAs/InGaAs inverted metamorphic (IMM) solar cell made using an ELO process. Specifically, the cell included an AlInGaP top cell, a GaAs middle cell and an InGaAs bottom cell overlaying a metal backing layer. As noted above, additional details regarding manufacturing of the triple-junction IMM solar cell may be found in U.S. Pat. No. 7,994,419, which is incorporated by reference herein in its entirety. The solar cell thickness was less than 40 microns. The solar cells flexibly conformed to curved surfaces of the RAVEN model UAV. The triple-junction IMM solar cell had a mass density of less than 250 g/m$^2$.

Figure 14:
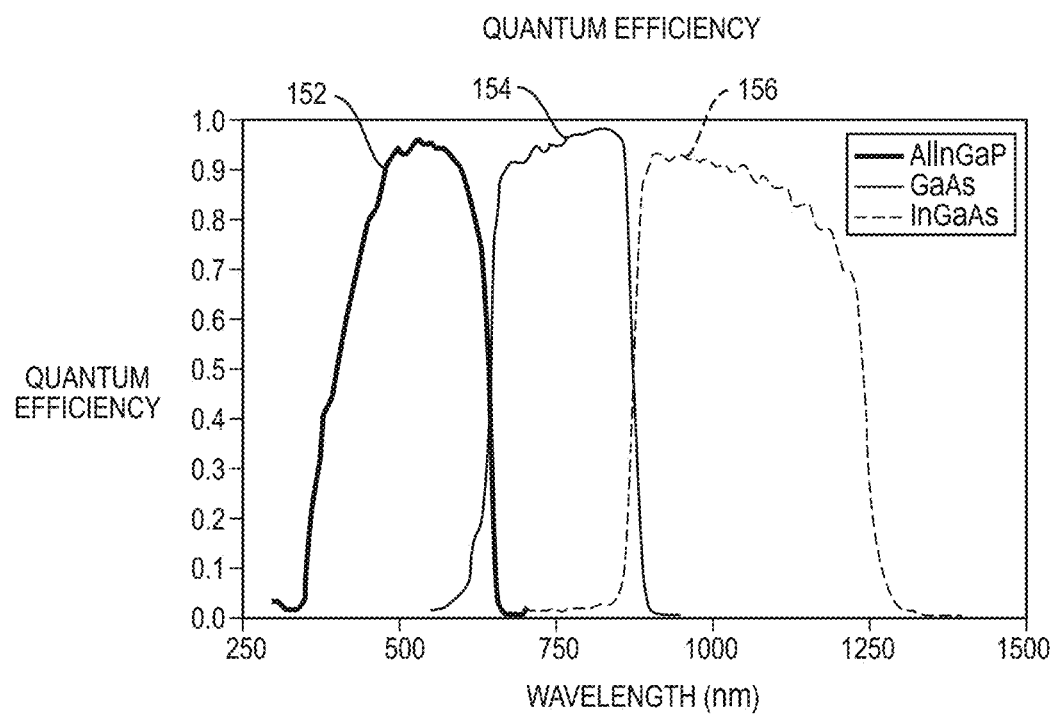
FIG. 14 is a graph of quantum efficiency for subcells of a triple junction inverted metamorphic (IMM) solar cell used in the example kit.
Figure 15:
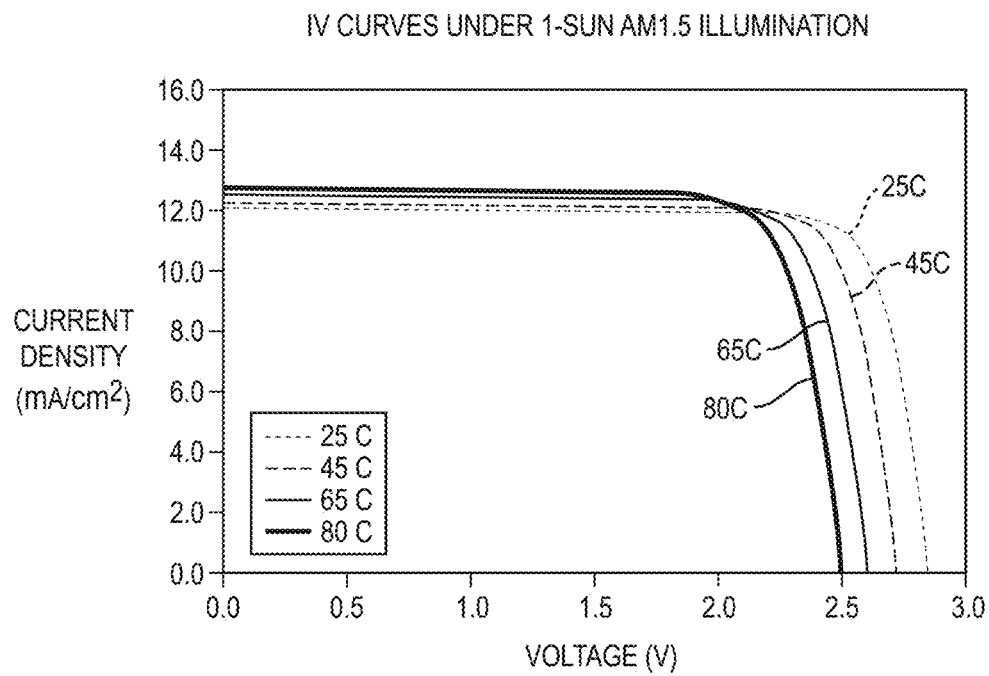
FIG. 15 is a graph of IV data for the IMM solar cells used in the example kit.

FIG. 14 is a graph showing the quantum efficiency of the individual sub cells, specifically the top cell AlInGaP (152), the middle cell GaAs (154), and the bottom cell InGaAs (156). The solar cell had a demonstrated efficiency of greater that 30% under 1-sun AM 1.5. FIG. 15 is a graph of I-V curves under 1-sun AM 1.5 illumination for different temperatures. The table below lists the critical cell parameters for the IMM triple-junction solar cell at various temperatures and the temperature dependence of various cell parameters.

TABLE 1

Critical Cell Parameters

| Temperature (° C.) | $J_{sc}$ (mA/cm$^2$) | $V_{oc}$ (V) | Efficiency (%) |
|---|---|---|---|
| 25 | 12.07 | 2.83 | 30.0 |
| 45 | 12.26 | 2.70 | 28.8 |
| 65 | 12.47 | 2.57 | 27.6 |
| 80 | 12.74 | 2.47 | 26.7 |

TABLE 2

Temperature Dependence of Cell Parameters

| Quantity | Value | Units |
|---|---|---|
| $\Delta J_{sc}/\Delta T$ | 0.0118 | mA cm$^{-2}$ K$^{-1}$ |
| $\Delta V_{oc}/\Delta T$ | −0.0065 | mV K$^{-1}$ |
| $\Delta$Efficiency/$\Delta T$ | −0.06 | % K$^{-1}$ |

The power per unit area of the solar cell was greater than 250 W/m$^2$ with AM 1.5 illumination. The specific power of the solar cell was greater than 1,000 W/kg.

The solar cells were interconnected to form an array. The triple junction IMM solar cells produced by ELO were laminated between polymer films to form flexible solar sheets. Specifically, the solar array was packaged between two sheets of a polymer material (such as TEFLON) using sheets of transparent pressure sensitive adhesive (PSA) to attach the array to the polymer sheets. The top and bottom polymer sheets were transparent; however, in other embodiments the bottom polymer sheet need not be transparent. The antireflection coating of the cells was designed to give optimum performance with the polymer sheet and PSA. Electrical leads protruded from the solar sheets. The solar sheets were mounted on the top surface of the wing of the UAV using a sheet of PSA. The power conditioning circuitry (PCC) was installed in the UAV, specifically in the wing. In other embodiments the PCC could be disposed at least partially in the fuselage. The PCC was connected to the solar sheets using the leads. Another set of leads routed the output of the PCC to the battery. The output of the PCC was connected in parallel with the output of the battery.

The flexible solar sheets had a demonstrated efficiency of at least 30%. The flexible solar sheets had an areal mass density of less than 250 g/m$^2$, and a power per unit area of greater than 250 W/m$^2$ in AM 1.5 illumination. The flexible solar sheets had a specific power of greater than 430 W/kg. The solar sheets were about 215 μm thick.

In some embodiments, the plurality of solar cells are integrated into a component of a UAV. For example, solar sheets may be produced as described above and then the solar sheets incorporated into a wing as the wing is produced using a molding process.

Although some embodiments are described herein with respect to battery-powered UAVs, one of ordinary skill in the art will recognize that this disclosure also applies UAVs incorporating other types of devices for storing electrical energy (e.g., fuel cells). Thus, kits and methods for increasing the endurance of electrically-powered UAVs (e.g., fuel-cell powered UAVs, battery-powered UAVs) fall within the scope of this disclosure.

While the present invention has been described with reference to illustrative embodiments thereof, those skilled in the art will appreciate that various changes in form in detail may be made without parting from the intended scope of the present invention as defined in the appended claims.

Example 2—Example Solar Sheet A

The inventors made and tested an example solar sheet, which is referred to as example solar sheet A. The solar cells used in example solar sheet A were flexible and triple-junction AlInGaP/GaAs/InGaAs inverted metamorphic (IMM) solar cells made using an ELO process. Specifically, the cell included an AlInGaP top cell, a GaAs middle cell and a InGaAs bottom cell overlaying a metal backing layer. As noted above, additional details regarding manufacturing of a triple-junction IMM solar cell, may be found in U.S. Pat. No. 7,994,419, which is incorporated by reference herein in its entirety. The metal backing layer of each solar cell was about 25 microns thick. Example solar sheet A had an areal mass of 543 g/m$^2$. The areal power of example solar sheet A was measured to be 230 W/m$^2$ under AM1.5 and 290 W/m$^2$ under AM0. The specific power of example solar sheet A was 440 W/kg under AM1.5 and 540 W/kg under AM0.

The layers of example solar sheet A generally corresponded to the layers of solar sheet 90 described above with respect to FIGS. 17A and 17B except with the addition of a polymer bottom sheet underlying the first adhesive layer. FIG. 19A shows the layers of example solar sheet A 190. Specifically, example solar sheet A 192 included a plurality of solar cells 194 each having a top surface and a bottom surface. Example solar sheet A 192 included a first adhesive layer in contact with the bottom surface of each solar cell 194. Example solar sheet A 190 also included a second adhesive layer 196 in contact with the top surface of each of the plurality of solar cells 194. Example solar sheet A 190 included a first polymer layer 198, which may be described as a polymer top sheet, attached to the second adhesive layer 196, and a second polymer layer 188, which may be described as a polymer bottom sheet, attached to the first adhesive layer 192. The solar sheet also included interconnects 189 between the solar calls 194 and the second adhesive layer 196.

Figure 19B:
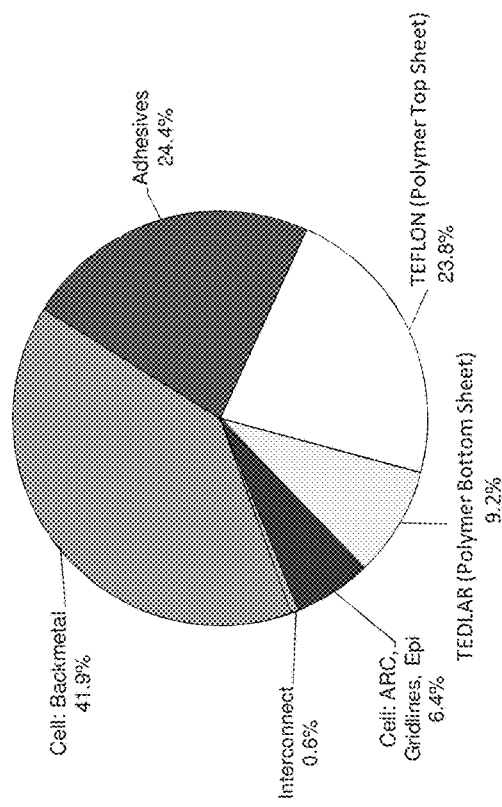
FIG. 19B is a graph of percentage masses of various layers in example solar sheet A, as taught herein.

Table 3 below lists the different layers of example solar sheet A and the materials used for each layer. In addition, Table 3 shows the areal mass of each layer and contribution of the mass of each layer to the total mass. FIG. 19B graphically illustrates how the mass of each layer contributes to the total mass of the solar sheet A.

TABLE 3

Layers of Example Solar Sheet A

| Layer | Mass/Area of Solar Sheet (g/m²) | % Mass of Solar Sheet |
|---|---|---|
| Polymer Top Sheet-TEFLON | 122 | 23.8% |
| Second Adhesive Layer-NT 1001 | 62 | 12.2% |
| Interconnects-Tabs | 3 | 0.6% |
| Solar Cell excluding metal backing layer | 33 | 6.4% |
| Metal Backing Layer of solar cell | 214 | 41.9% |
| First Adhesive Layer-NT 1001 | 62 | 12.2% |
| Polymer bottom Sheet-TEDLAR | 47 | 9.2% |
| TOTAL | 543 | |

Example 3—Example Solar Sheet B

Inventors made and tested an improved solar sheet identified as example solar sheet B herein. The layer structure of example solar sheet B corresponds to that shown in FIGS. 17A and 17B and described above. The solar cells used in example solar sheet B were flexible and triple-junction AlInGaP/GaAs/InGaAs inverted metamorphic (IMM) solar cells made using an ELO process. Specifically, the cell included an AlInGaP top cell, a GaAs middle cell and an InGaAs bottom cell overlaying a metal backing layer.

The specific power of example solar sheet B was significantly increased as compared to that of example solar sheet A. In order to decrease the areal mass of the solar sheet, the inventors reduced the thickness of the polymer layer top sheet, omitted the polymer bottom sheet and reduced the thickness of metal backing layer in the solar cells. More specifically, the inventors reduced the thickness of the top polymer layer (i.e., the TEFLON sheet), from about 50 microns in Example 2, to about 25 microns. The thicknesses of the first and second adhesive layers were reduced from 25 micron to 12 microns. In addition, the thickness of the metal backing layer in the solar cells was reduced from 25 to 13 microns. The areal mass was about 240 g/m². The areal power of solar sheet was measured to be about 260 W/m² under AM1.5 and 330 W/m² under AM0. The specific power of example solar sheet B was 1080 W/kg under AM1.5 and 1380 W/kg under AM0, was a significant increase over the specific power of example solar sheet A. As the thickness of the solar cells and solar sheets was reduced, it became more challenging to handle the solar cells and components of solar sheets during the assembly of the solar sheets. For example, due to the reduction in thickness, various components of the solar sheet tended to curl easily, increasing the difficulties in making the solar sheets.

Figure 20:
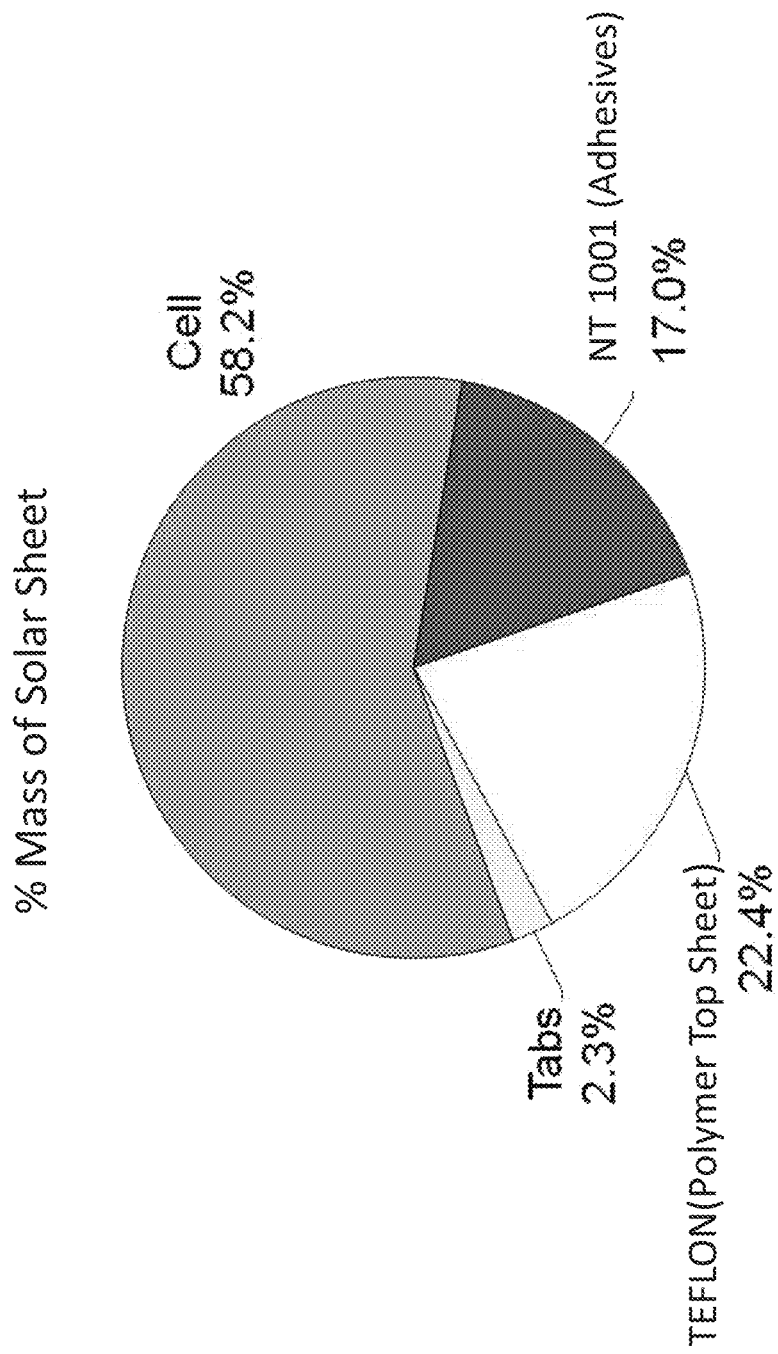
FIG. 20 is a graph of percentage masses of various layers in an example solar sheet B, as taught herein.

Table 4 shows the different layers of example solar sheet B and the materials used for each layer. In addition, Table 4 shows the areal mass of each layer and the contribution of the mass of each layer to the total mass. FIG. 20 graphically illustrates how the mass of each layer contributes to the total mass of example solar sheet B.

TABLE 4

Layers of Example Solar Sheet B

| Layer | Mass/Area of Solar Sheet (g/m²) | % Mass of Solar Sheet |
|---|---|---|
| Polymer Top Sheet-TEFLON | 52.5 | 9.9% |
| Second Adhesive Layer-NT 1001 | 20.0 | 3.8% |
| Interconnects-Tabs | 5.5 | 1.0% |
| Solar Cell | 136.5 | 25.8% |
| First Adhesive Layer-NT 1001 | 20.0 | 3.8% |
| TOTAL | 234.5 | |

Example 4—Example Solar Sheet C with Frame Adhesive Layer

Example solar sheet C includes a first adhesive layer including cutouts as shown in FIG. 18A and described above. The structure of the layers of the solar sheet is shown in FIG. 17 and described above. The solar cells in example solar sheet C are flexible and triple-junction AlInGaP/GaAs/InGaAs inverted metamorphic (IMM) solar cells made using an ELO process. Specifically, the cell includes an AlInGaP top cell, a GaAs middle cell and an InGaAs bottom cell overlaying a metal backing layer. Rather than a continuous layer of adhesive between the bottom surface of plurality of solar cells and the surface to which the solar sheet is to be adhered, Example solar sheet C employs cutouts corresponding to the position of each solar cell to greatly decrease the amount of adhesive used and the total mass of the adhesive used for the second adhesive layer. In this example, 90% of the adhesive material is removed. Further, the thickness of metal backing layer is reduced to 5 microns for each solar cell. The areal power of the solar sheet is 290 W/m² under AM1.5 and 3700 W/m² under AM0. Example solar sheet C has increased specific power as compared to example solar sheet A and example solar sheet B. The specific power of the solar sheet is 1810 W/kg under AM1.5 and 2310 W/kg under AM0.

As may be recognized by those of ordinary skill in the pertinent art based on the teachings herein, numerous changes and modifications may be made to the above-described and other embodiments of the present disclosure without departing from the spirit of the invention as defined in the appended claims. Accordingly, this detailed description of embodiments is to be taken in an illustrative, as opposed to a limiting, sense. Those skilled in the art will recognize, or be able to ascertain using no more than routine experimentation, many equivalents to the specific embodiments of the described herein. Such equivalents are intended to be encompassed by the following claims.

The invention claimed is:

1. A solar sheet comprising:
   a plurality of solar cells each having a specific power in a range of 1000-4500 W/kg under air mass coefficient 1.5 (AM1.5) light or a specific power in a range of 1270-5680 W/kg under AM0 light; and
   a polymer layer to which the plurality of solar cells is attached.

2. The solar sheet of claim 1, wherein each of the plurality of solar cells has a specific power in a range of 1500-4500 W/kg under AM1.5 or a specific power in a range of 1870-5680 W/kg under AM0.

3. The solar sheet of claim 1, wherein the solar sheet has a specific power in a range of 400-2350 W/kg under AM1.5 or in a range of 510-3000 W/kg under AM0.

4. The solar sheet of claim 1, wherein the solar sheet is configured to be attached to a wing of an unmanned aerial vehicle.

5. The solar sheet of claim 1, wherein each of the plurality of solar cells has an areal power in a range of 260-360 W/m$^2$ under AM1.5 or an areal power in a range of 325-450 W/m$^2$ under AM0.

6. The solar sheet of claim 1, wherein the solar sheet has an areal power in a range of 200-330 W/m$^2$ under AM1.5 or an areal power in a range of 260-410 W/m$^2$ under AM0.

7. The solar sheet of claim 1, wherein each of the plurality of solar cells has an areal mass in a range of 70-280 g/m$^2$.

8. The solar sheet of claim 1, wherein the solar sheet has an areal mass in a range of 120-570 g/m$^2$.

9. The solar sheet of claim 1, wherein the solar sheet is a flexible solar sheet.

10. The solar sheet of claim 1, wherein the polymer layer has a thickness in a range of 15 microns to 30 microns.

11. The solar sheet of claim 1, wherein the plurality of solar cells comprises solar cells produced using an epitaxial lift-off process.

12. The solar sheet of claim 1, wherein each of the plurality of solar cells includes a metal backing layer.

13. The solar sheet of claim 12, wherein the metal backing layer has a thickness in a range of 2 to 30 microns.

14. The solar sheet of claim 1, further comprising a first adhesive layer in contact with a bottom surface of each solar cell in the plurality of solar cells.

15. The solar sheet of claim 14, wherein the first adhesive layer has a thickness in a range of 8 microns to 15 microns.

16. The solar sheet of claim 14, wherein the first adhesive layer includes a plurality of cutouts, each of the plurality of cutouts corresponding to a position of a corresponding solar cell in the plurality of solar cells.

17. The solar sheet of claim 14, further comprising a second adhesive layer that attaches the plurality of solar cells to the polymer layer.

18. The solar sheet of claim 1, wherein each of the plurality of solar cells is an inverted metamorphic triple-junction solar cell.

19. The solar sheet of claim 18, wherein each of the plurality of solar cells comprises:
    a top subcell including an AlInGaP layer;
    a middle subcell including a GaAs layer;
    a bottom subcell including an InGaAs layer; and
    a metal backing layer in direct contact with the bottom subcell.

20. The solar sheet of claim 18, wherein each of the plurality of solar cells comprises:
    a top subcell including an InGaP layer;
    a middle subcell including a GaAs layer;
    a bottom subcell including an InGaAs layer; and
    a metal backing layer in direct contact with the bottom subcell.

* * * * *